United States Patent
Do

(10) Patent No.: US 9,773,761 B2
(45) Date of Patent: *Sep. 26, 2017

(54) ULTRA-SMALL LED ELECTRODE ASSEMBLY AND METHOD FOR MANUFACTURING SAME

(71) Applicant: PSI CO., LTD., Yongin-si (KR)

(72) Inventor: Young Rag Do, Seoul (KR)

(73) Assignee: PSI CO., LTD, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/903,858

(22) PCT Filed: Jul. 8, 2014

(86) PCT No.: PCT/KR2014/006123
§ 371 (c)(1),
(2) Date: Jan. 8, 2016

(87) PCT Pub. No.: WO2015/005655
PCT Pub. Date: Jan. 15, 2015

(65) Prior Publication Data
US 2016/0148911 A1  May 26, 2016

(30) Foreign Application Priority Data
Jul. 9, 2013 (KR) .......................... 10-2013-0080417

(51) Int. Cl.
*H01L 33/62* (2010.01)
*H01L 25/075* (2006.01)
(Continued)

(52) U.S. Cl.
CPC .......... *H01L 25/0753* (2013.01); *H01L 33/62* (2013.01); *H05K 1/0295* (2013.01);
(Continued)

(58) Field of Classification Search
CPC .................................................. H01L 25/0753
See application file for complete search history.

(56) References Cited

U.S. PATENT DOCUMENTS 9,570,425 B2 *   2/2017  Do ..................... H01L 25/0753
2008/0224608 A1 * 9/2008  Konishi .................... F21K 9/00
                                                                313/505
(Continued)

FOREIGN PATENT DOCUMENTS

JP         2011-205060         10/2011
KR         100903280           6/2009
(Continued)

OTHER PUBLICATIONS

International Search Report for KR/2014/006123, dated Oct. 7, 2014, 2 pages.

*Primary Examiner* — Eugene Lee
(74) *Attorney, Agent, or Firm* — Hoffman Warnick LLC

(57) ABSTRACT

Provided are a nano-scale LED assembly and a method for manufacturing the same. First, a nano-scale LED device that is independently manufactured may be aligned and connected to two electrodes different from each other to solve a limitation in which a nano-scale LED device having a nano unit is coupled to two electrodes different from each other in a stand-up state. Also, since the LED device and the electrodes are disposed on the same plane, light extraction efficiency of the LED device may be improved. Furthermore, the number of nano-scale LED devices may be adjusted. Second, since the nano-scale LED device does not stand up to be three-dimensionally coupled to upper and lower electrodes, but lies to be coupled to two electrodes different from each other on the same plane, the light extraction efficiency may be very improved. Also, since a separate layer is formed on a surface of the LED device to prevent the LED device and the electrode from being (Continued)

electrically short-circuited, defects of the LED electrode assembly may be minimized. Also, in preparation for the occurrence of the very rare defects of the LED device, the plurality of LED devices may be connected to the electrode to maintain the original function of the nano-scale LED electrode assembly.

5 Claims, 14 Drawing Sheets

(51) Int. Cl.
    *H05K 1/02*       (2006.01)
    *H05K 1/11*       (2006.01)
    *H05K 3/34*       (2006.01)
    *H01L 33/38*      (2010.01)

(52) U.S. Cl.
    CPC .............. *H05K 1/111* (2013.01); *H01L 33/38* (2013.01); *H01L 2924/0002* (2013.01); *H01L 2933/0066* (2013.01); *H05K 1/0296* (2013.01); *H05K 3/3442* (2013.01); *H05K 2201/0939* (2013.01); *H05K 2201/09236* (2013.01); *H05K 2201/09254* (2013.01); *H05K 2201/09381* (2013.01); *H05K 2201/09427* (2013.01); *H05K 2201/09954* (2013.01); *H05K 2201/10106* (2013.01); *H05K 2201/10583* (2013.01); *H05K 2201/10636* (2013.01); *H05K 2201/10651* (2013.01); *H05K 2203/048* (2013.01); *Y02P 70/611* (2015.11)

(56) References Cited

U.S. PATENT DOCUMENTS

| 2009/0174325 | A1* | 7/2009 | Van Bruggen | G09F 9/30 |
| | | | | 313/505 |
| 2010/0301731 | A1* | 12/2010 | Morikawa | H05K 1/0274 |
| | | | | 313/113 |
| 2011/0180817 | A1* | 7/2011 | Ishizaki | F21V 3/00 |
| | | | | 257/88 |
| 2011/0316011 | A1* | 12/2011 | Ito | H01L 25/167 |
| | | | | 257/88 |

FOREIGN PATENT DOCUMENTS

| KR | 1020100066768 | 6/2010 |
| KR | 1020100080423 | 7/2010 |
| KR | 1020100091269 | 8/2010 |
| KR | 1020120120377 | 11/2012 |
| KR | 1020120122159 | 11/2012 |

* cited by examiner

ULTRA-SMALL LED ELECTRODE ASSEMBLY AND METHOD FOR MANUFACTURING SAME

CROSS-REFERENCE TO RELATED APPLICATIONS

This U.S. non-provisional patent application claims priority under 35 U.S.C. §119 of Korean Patent Application No. 10-2013-0080417, filed on Jul. 9, 2013, the entire contents of which are hereby incorporated by reference.

BACKGROUND OF THE INVENTION

The present invention disclosed herein relates to a nano-scale LED electrode assembly and a method for manufacturing the same, and more particularly, to a nano-scale LED electrode assembly in which a nano-scale LED device having a nano unit is connected to a nano-scale electrode without causing defects such as an electrical short-circuit while maximizing light extraction efficiency and a method for manufacturing the same.

The development of light emitting diodes (LEDs) has been actively promoted by succeeding in combination of a high-quality single-crystal gallium nitride (GaN) semiconductor by applying a low-temperature GaN compound buffer layer, by Nakamura et al., at Nichia Chemical Corporation in Japan, 1992. Such an LED is a semiconductor having a structure in which an n-type semiconductor crystal having a plurality of carriers, i.e., electrons and a p-type semiconductor crystal having a plurality of carrier, i.e., holes are junctioned to each other by using characteristics of a compound semiconductor, that is to say, a semiconductor device that converts an electrical signal into light having a wavelength band on a desired region to emit the light.

The LED semiconductor is called a revolution of light as a green material because the LED semiconductor has very low energy consumption due to high light conversion efficiency and is semi-permanent in the lifespan and environmentally friendly. Recently, as compound semiconductor technologies are developed, red, orange, green, blue, and white LEDs having high brightness have been developed. Also, the LEDs are being applied to various fields such as traffic lights, mobile phones, headlights for vehicles, outdoor electronic display boards, LED backlight units, and indoor/outdoor lightings, and also studies on the LEDs are being actively carried out. Particularly, a GaN-based compound semiconductor having a wide band gap may be a material that is used for manufacturing LED semiconductors which emit green and blue light and ultraviolet rays. Here, since a white LED device is manufactured by using a blue LED device, many studies with respect to the manufacture of the white LED device using the blue LED device are being carried out.

Also, due to the utilization of the LED semiconductor in various fields and studies on the LED semiconductor, an LED semiconductor having high output is required, and it is very important to improve efficiency of the LED semiconductor. However, it is difficult to manufacture the blue LED device having high efficiency. Drawbacks in improvement of efficiency of the blue LED device may cause the difficulty in manufacturing and a high refractive index between the manufactured LED and the GaN-based semiconductor. First, the difficulty in the manufacturing may be caused due to the difficulty in manufacturing of a substrate having the same lattice constant as the GaN-based semiconductor. A GaN epitaxial layer formed on the substrate may have many defects when the lattice constant with the substrate is significantly mismatched to deteriorate efficiency and reduce performance.

Next, light emitted from an active layer of the LED may not be escaped to the outside, but be totally reflected to the inside of the LED due to the high refractive index between the GaN-based semiconductor of the blue LED and the atmosphere. The totally reflected light may be reabsorbed to the inside to deteriorate the efficiency of the LED. The efficiency may be called light extraction efficiency of the LED device. To solve the above-described limitation, many studies are being carried out.

To utilize the LED device as lightings and displays, an LED device and an electrode for applying power to the LED device are required. Also, various studies on an arrangement of the LED device and two electrodes different from each other in connection with application purpose, reduction of a space occupied by the electrode, or a manufacturing method.

Studies relating to the arrangement of the LED device and the electrode may be classified into growth of the LED device and an arrangement of the electrode after the LED device is separately grown.

First, in studies on the growth of the LED device on the electrode, there is a bottom-up method in which the LED device and the electrode are formed and arranged at the same time through a series of manufacturing processes by using a method in which a lower electrode is formed on a substrate in the form of a thin film, and an n-type semiconductor layer, an active layer, a p-type semiconductor layer, and an upper electrode are successively stacked on the lower electrode and then etched, or the previously stacked are etched before the upper electrode is stacked and then the upper electrode is stacked.

Next, a method in an electrode is disposed after an LED device is separately and independently grown may be a method in which LED devices that are independently grown and manufactured through separate processes are disposed one by one on a patterned electrode.

The former method may have a limitation in that it is very difficult to crystallographically grow of high crystalline/high efficiency thin film and LED device, and the latter method may have a limitation in that light extraction efficiency is reduced to deteriorate light emitting efficiency.

Also, according to the latter method, although a three-dimensional LED device is connected to the electrode in a stand-up state in case of the general LED device, it is very difficult to stand up on the electrode in case of a nano-scale LED device having a nano unit. Korean Patent Application No. 2011-0040174 by the inventor of this application discloses a coupling link for easily coupling a nano-scale LED device having a nano unit to electrodes in a state where the LED device three-dimensionally stands up. However, it is very difficult to couple the nano-scale LED device to the electrode in the three-dimensionally stand-up state.

Furthermore, the LED devices that are independently manufactured have to be disposed one by one on the electrodes. However, in case of the nano-scale LED device, it is very difficult to respectively locate the LED devices on two nano-scale electrodes different from each other within a desired range. Also, even though the LED devices are disposed on the two nano-scale electrodes, defects such as electrical short-circuit between the electrode and the nano-scale LED may frequently occur, and it may be difficult to realize the desired electrode assembly.

A structure of an address electrode line for an LED module and a method for manufacturing the same are disclosed in Korean Patent Application No. 2010-0042321.

In case of this application, a lower electrode is formed on a substrate in the form of a thin film, and an insulation layer and an upper electrode are successively stacked on the lower electrode and then etched to manufacture the electrode line. Then, an LED chip is mounted on the upper electrode. However, if the mounted LED chip has a nano size, it may be very difficult to accurately mount the three-dimensional LED chip on the upper electrode. Also, even though the LED chip is mounted on the upper electrode, it may be very difficult to connect the mounted LED chip having the nano size to the lower electrode. In addition, since n-type and p-type semiconductor layers of the mounted LED chip form upper and lower layers with respect to a substrate, light emitted from the active layer may be blocked by the LED chip and thus may not be escaped, but be absorbed to the inside, thereby deteriorating light extraction efficiency.

SUMMARY OF THE INVENTION

The present invention provides a method for manufacturing a nano-scale LED electrode assembly, in which an independently manufactured nano-scale LED device having a nano unit, is connected to two electrodes different from each other without causing defects such as an electrical short-circuit to improve light extraction efficiency.

The present invention also provide a method for manufacturing a nano-scale LED electrode assembly, in which nano-scale LED devices are aggregated at only a specific portion on an electrode region, or the nano-scale LED device are concentratedly distributed on a desired mounting region.

The present invention also provide a nano-scale LED electrode assembly in which a nano-scale LED device having a nano unit is connected to two electrodes different from each other without causing an electrical short-circuit to improve light extraction efficiency.

In one embodiment of the present invention, an a method for manufacturing a nano-scale LED assembly includes: (1) injecting a solution to an electrode line including a base substrate, a first electrode formed on the base substrate, and a second electrode spaced apart form the first electrode on the same plane as the first electrode; and (2) applying power to the electrode line to connect a plurality of nano-scale LED devices to both of the first and second electrodes, thereby self-aligning the plurality of nano-scale LED devices, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film covering the whole outer surface of a portion of at least the active layer to prevent an electrical short-circuit occurring due to contact between the active layer of the nano-scale LED device and the electrode line from occurring, and a width X of the first electrode, a width Y of the second electrode, a distance Z between the first electrode and the second electrode adjacent to the first electrode, and a length H of the nano-scale LED device satisfy following relation expression 1.

$0.5Z \leq H < X+Y+2Z$, where 100 nm $\langle X \leq 10$ μm, 100 nm $\langle Y \leq 10$ μm, and 100 nm $\langle Z \leq 10$ μm.[Relation Expression 1]

In the step (1), the first and second electrodes may be spirally or intergititally disposed to be spaced apart from each other.

The nano-scale LED device may further include a hydrophobic film applied to an outer surface of the insulation film to prevent the nano-scale LED devices from be aggregated with each other.

The first and second electrode layers of the nano-scale LED device are not coated with the insulation film.

The nano-scale LED device may have a length of about 100 nm to about 10 μm.

The step (1) may include: 1-1) manufacturing the electrode line including the base substrate, the first electrode formed on the base substrate, and a second electrode spaced apart from the first electrode on the same plane as the first electrode; 1-2) forming an insulation barrier surrounding an electrode line region on which the nano-scale LED device is mounted on the base substrate; and 1-3) injecting the solution containing the plurality of nano-scale LED devices to the electrode line region surrounded by the insulation barrier, wherein a vertical distance from the base substrate to an upper end of the insulation barrier is about 0.1 μm to about 100 μm.

In the step (2), the applied power may have a voltage of about 0.1 V to about 1,000 V and a frequency of about 10 Hz to about 100 GHz.

In the step (2), the number of nano-scale LED devices connected to both of the first and second electrodes may be about 2 to about 100,000 per an area (100×100 μm$^2$) of the electrode line on which the nano-scale LED device is mounted.

The method may further include forming a metal ohmic layer at each of connection potions between the first and second electrodes and the LED device after the step (2).

The nano-scale LED device may have an aspect ratio of about 1.2 to about 100.

In other embodiment of the present invention, a method for manufacturing a nano-scale LED assembly includes: (1) injecting a plurality of nano-scale LED devices to an electrode line including a base substrate, a first electrode formed on the base substrate, and a second electrode spaced apart form the first electrode on the same plane as the first electrode; and (2) injecting a solvent to the electrode line to connect the plurality of nano-scale LED devices to both of the first and second electrodes, thereby applying power to the electrode line to self-align the plurality of nano-scale LED devices, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film covering the whole outer surface of a portion of at least the active layer to prevent an electrical short-circuit occurring due to contact between the active layer of the nano-scale LED device and the electrode line from occurring, and a width X of the first electrode, a width Y of the second electrode, a distance Z between the first electrode and the second electrode adjacent to the first electrode, and a length H of the nano-scale LED device satisfy following relation expression 1.

$0.5Z \leq H < X+Y+2Z$, where 100 nm $\langle X \leq 10$ μm, 100 nm $\langle Y \leq 10$ μm, and 100 nm $\langle Z \leq 10$ μm.[Relation Expression 1]

In further another embodiment of the present invention, a nano-scale LED electrode assembly includes: a base substrate; an electrode line including a first electrode formed on the base substrate and a second electrode spaced apart from the first electrode on the same plane as the first electrode; and a plurality of nano-scale LED devices connected to both of the first and second electrodes, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film covering the whole outer surface of a portion of at least the active layer to prevent an electrical short-circuit occurring due to contact between the active layer of the nano-scale LED device and the electrode line from occurring, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z, \text{ where } 100 \text{ nm} \langle X \leq 10 \text{ μm}, 100 \text{ nm} \langle Y \leq 10 \text{ μm}, \text{ and } 100 \text{ nm} \langle Z \leq 10 \text{ μm}.$$ [Relation Expression 1]

The first and second electrodes may be spirally or intergititally disposed to be spaced apart from each other.

The first and second electrode layers of the nano-scale LED device are not coated with the insulation film.

The number of nano-scale LED devices may be about 2 to about 100,000 per an area (100 μm×100 μm) of the nano-scale LED electrode assembly.

The nano-scale LED devices may lie on the base substrate to improve extraction efficiency, and a metal ohmic layer may be provided at a connection portion between at least one of the first and second electrodes and the nano-scale LED device.

The nano-scale LED electrode assembly may further include an insulation barrier surrounding an electrode line region to which the nano-scale LED device is connected, and the insulation barrier is disposed on the base substrate, wherein a vertical distance from the base substrate to an upper end of the insulation barrier may be about 0.1 μm to about 100 μm.

The nano-scale LED device may have a length of about 100 nm to about 10 μm and an aspect ratio of about 1.2 to about 100.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
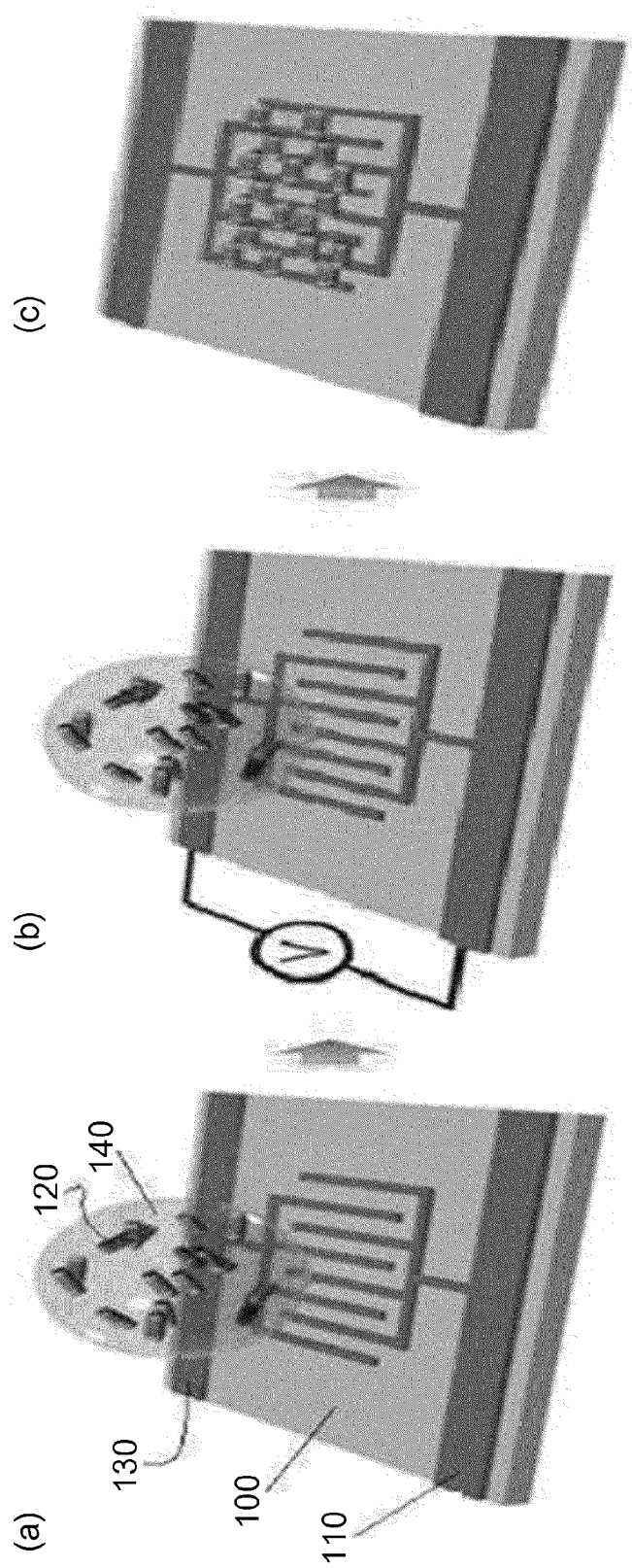
FIG. 1 is a perspective view illustrating a process of manufacturing a nano-scale LED electrode assembly according to a first embodiment of the present invention.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present.

In the description according to an embodiment of the present invention, the terms "first electrode" and "second electrode" may include an electrode region on which a nano-scale LED is substantially mounted or an electrode region that is further provided according to a method for disposing an electrode on a base substrate in addition to the above-described electrode region. However, the nano-scale LED electrode assembly according to the present invention may denote an electrode region on which the nano-scale ELD is substantially mounted.

In the description according to an embodiment of the present invention, a unit electrode may denote an arrangement region on which two electrodes for independently operating the arranged nano-scale LED devices are disposed, and a unit electrode area may denote an area of the arrangement region.

In the description according to an embodiment of the present invention, the term "connection" may denote a state in which the nano-scale LED device is mounted on two electrodes (e.g., a first electrode and a second electrode) different from each other. Also, the term "electrical connection" may denote a state in which a nano-scale LED device is mounted on two electrodes different from each other, and also, power is applied to an electrode line to allow the nano-scale LED device to emit light.

Exemplary embodiments of the present invention will now be described in detail with reference to the accompanying drawings.

As described above, in the bottom-up manner according to the related art, it is very difficult to crystallographically grow a thin film having high crystalline/high efficiency and an LED device having an n-type/quantum well/p-type stack structure. According to a method in which an LED device is independently grown and manufactured through a separate process, and then LED devices are disposed one by one on a patterned electrode, in case of a general LED device, a three-dimensional LED device stands up and then is connected to an electrode. However, if the LED device is a nano-scale LED device having a nano unit, it is very difficult to stand up on the electrode. Also, in case of the nano-scale LED device having the nano unit, it is very difficult to align the nano-scale LED device on a desired region of the nano-scale two electrodes different from each other and connect the nano-scale LED device to the two electrodes without occurring defects such as electrical short-circuit.

A first embodiment of the present invention provides a method for manufacturing a nano-scale LED assembly, the method including: (1) injecting a solution to an electrode line including a base substrate, a first electrode formed on the base substrate, and a second electrode spaced apart form the first electrode on the same plane as the first electrode; and (2) applying power to the electrode line to connect a plurality of nano-scale LED devices to both of the first and second electrodes, thereby self-aligning the plurality of nano-scale LED devices, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers the whole outer surface of a portion of at least the active layer to prevent an electrical short-circuit occurring due to contact between the active layer of the nano-scale LED device and the electrode line from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$0.5Z \leq H < X+Y+2Z$, where 100 nm $\langle X \leq 10$ μm, 100 nm $\langle Y \leq 10$ μm, and 100 nm $\langle Z \leq 10$ μm.[Relation Expression 1]

Thus, when the nano-scale LED device according to the related art stands up and then is three-dimensionally coupled to the electrode, the limitation in which it is difficult to allow the nano-scale LED device to stand up and the limitation in which it is difficult to couple the nano-scale LED device to one-to-one correspond to the nano-scale electrodes different from each other may be solved. Also, the nano-scale LED device may be aligned on the desired electrode region of the nano-scale electrode, and also, the nano-scale LED device may be connected to the electrode without causing defects such as the electrical short-circuit. Furthermore, due to directivity of the nano-scale LED device connected to the electrode, an amount of photons emitted to air among photons generated in an active layer may increase to significantly improve light extraction efficiency of the nano-scale LED assembly.

In a step (1) according to a first embodiment of the present invention, a solution containing a plurality of nano-scale LED devices is injected to a base substrate and an electrode line including a first electrode formed on the base substrate and a second electrode formed on the same plane as the first electrode and spaced apart from the first electrode.

FIG. 1 is a perspective view illustrating a process of manufacturing a nano-scale LED electrode assembly according to a first embodiment of the present invention. FIG. 1A illustrates a first electrode 110 formed on a base substrate 100, a second electrode 130 spaced apart from the first electrode 110 on the same plane as the first electrode 110, and a solution (an LED device 120 and a solvent 140) containing a plurality of nano-scale LED devices.

Figure 2:
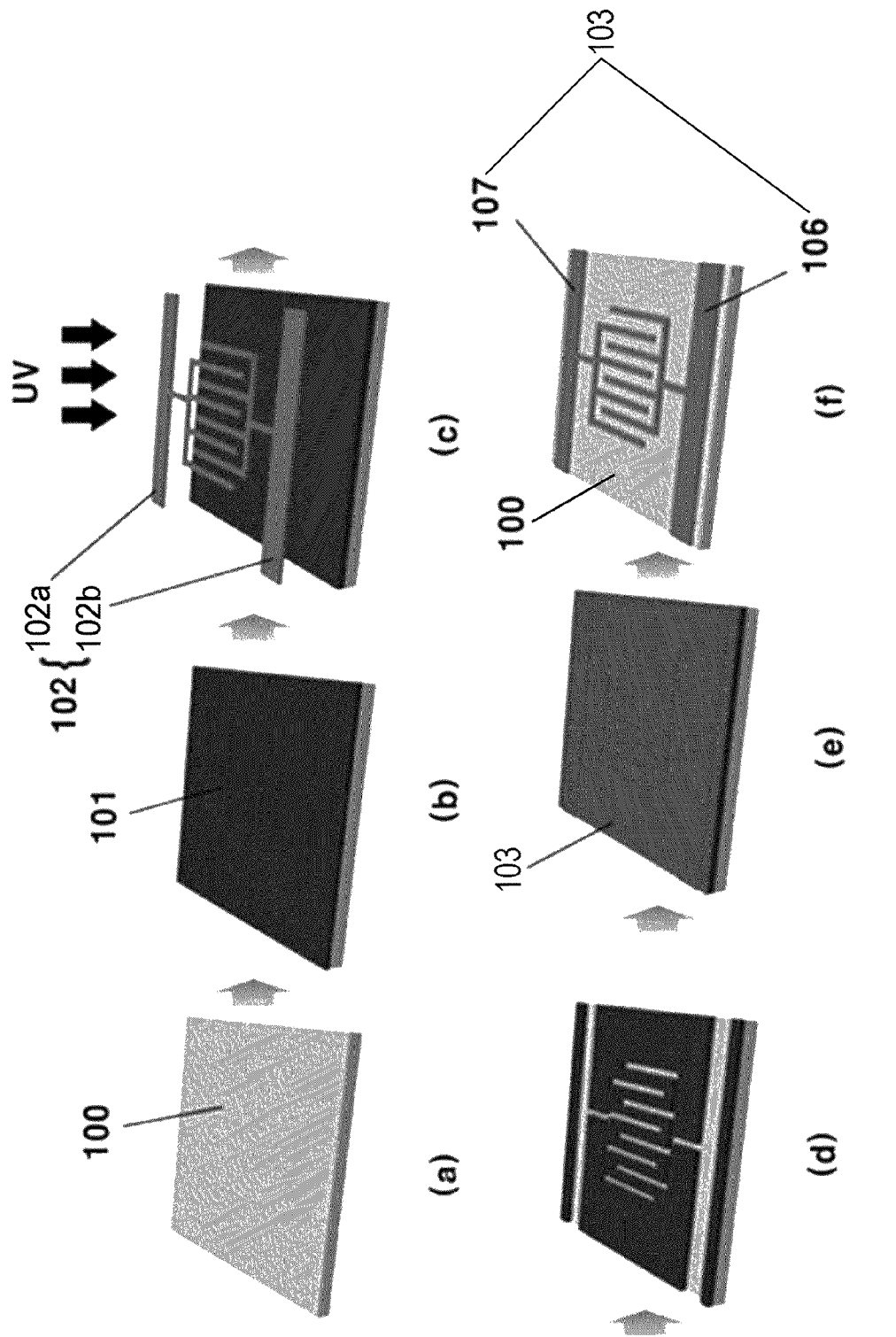
FIG. 2 is a perspective view illustrating a process of manufacturing an electrode line according to an embodiment of the present invention.

First, a method for manufacturing an electrode line for the nano-scale LED will be described. FIG. 2 is a perspective view illustrating a process of manufacturing the electrode line formed on the base substrate according to an embodiment of the present invention. However, the present invention is not limited to the process for manufacturing the electrode line for the nano-scale LED that will be described below.

First, in FIG. 2A, one of a glass substrate, a crystal substrate, a sapphire substrate, a plastic substrate, and a bendable and flexible polymer film may be used as the base substrate 100 on which the electrode line is formed. In detail, the substrate may be transparent. However, the present invention is not limited to a kind of substrate. For example, if a general electrode is formed on the base substrate, various kinds of substrate may be used as the base substrate.

The base substrate is not limited to an area thereof. The base substrate may have an area that is variable in consideration of an area of the first electrode to be formed on the base substrate, an area of the second electrode, a size of the nano-scale LED device connected to the first and second electrodes, and the number of nano-scale LED devices. For example, the base substrate may have a thickness of about 100 μm to about 1 mm, but is not limited thereto.

Thereafter, a photo resist (PR) 101 may be applied on the base substrate 100 as illustrated in FIG. 2B. The photo resist 101 may be a photo resist that is generally used in the ordinary skilled in the art. The method for applying the photo resist on the base substrate 100 may include one of a spin coating method, a spray coating method, and a screen printing method. Preferably, the spin coating method is used, but is not limited thereto. A specific coating method may be performed by the method that is well-known in the ordinary skilled in the art. The coating photo resist 101 may have a thickness of about 0.1 μm to about 10 μm. However, the photo resist 101 for coating may have a thickness that is variable in consideration of a thickness of the electrode to be deposited on the base substrate.

After the photo resist 101 is formed on the base substrate 101 as described above, a mask 102 having patterns 102a and 102b corresponding to an electrode line (see FIG. 3) on which the first and second electrode are interdigitally disposed to be spaced apart from each other may be placed on the photo resist 101 as illustrated in FIG. 2C and then be exposed to UV rays that are irradiated from an upper side of the mask 103.

Thereafter, the photo resist that is not exposed may be immersed into a general photo resist solvent and then removed. Thus, a portion of the exposed photo resist layer on which the electrode line will be formed as illustrated in FIG. 2D may be removed. In the electrode line for the nano-scale LED, the pattern 102a corresponding to the first electrode line may have a width of about 100 nm to about 50 µm, and the pattern 102b corresponding to the second electrode line may have a width of about 100 nm to about 50 µm, but are not limited thereto.

Thereafter, an electrode formation material 103 may be deposited on a portion in which the photo resist layer is removed in the form of the electrode line mask 102 as illustrated in FIG. 2E. In case of the first electrode, the electrode formation material may include at least one metal material selected from the group consisting of aluminum, titanium, indium, gold, and silver or at least one transparent material selected from the group consisting of ITO (Indium Tin Oxide), ZnO:Al, and CNT-conductive polymer complex. If two kinds of electrode formation materials are provided, the first electrode may have a structure in which at least two kinds of materials are stacked. In more detail, the first electrode may be an electrode in which two kinds of materials, i.e., titanium/gold are stacked. However, the first electrode is not limited to the above-described materials.

In case of the second electrode, the electrode formation material may include at least one metal material selected from the group consisting of aluminum, titanium, indium, gold, and silver or at least one transparent material selected from the group consisting of ITO (Indium Tin Oxide), ZnO:Al, and CNT-conductive polymer complex. If two kinds of electrode formation materials are provided, the second electrode may have a structure in which at least two kinds of materials are stacked. In more detail, the second electrode may be an electrode in which two kinds of materials, i.e., titanium/gold are stacked. However, the second electrode is not limited to the above-described materials.

The first and second electrodes may be formed of the same material or formed of materials different from each other. The electrode formation material may be deposited by using one of a thermal deposition method, an E-beam deposition method, a sputtering deposition method, and a screen printing method. Preferably, the thermal deposition method is used, but it not limited thereto.

After the electrode formation material 103 is deposited, as illustrated in FIG. 2F, when the photo resist 101 applied on the base substrate 100 is removed by using one photo resist stripper of 1-methyl-2-pyrrolidone (NMP) and dimethyl sulfoxide (DMSO), the electrode line 103a (see reference numeral 110 of FIG. 1) and 103b (see reference numeral 130 of FIG. 1) may be manufactured.

In the electrode line manufactured through the above-described method, a unit electrode area, i.e., an arrangement region on which two electrodes for independently operating the arranged nano-scale LED devices are disposed may have an area of about 1 µm$^2$ to about 100 cm$^2$, preferably, about 10 µm$^2$ to about 100 mm$^2$, but is not limited thereto. Also, the electrode line may include a single unit electrode or a plurality of unit electrodes.

Furthermore, in the electrode line, a spaced distance between the first and second electrodes may be less than a length of the nano-scale LED device. Thus, the nano-scale LED device may be connected between the first and second electrodes in a state in which the nano-scale LED device is inserted or disposed in a laid state between the two electrodes.

The electrode line that is applicable to the present invention may include the first electrode and the second electrode that is disposed on the same plane as the first electrode and spaced apart from the first electrode, wherein the nano-scale LED is capable of being mounted on the electrode line. Here, the specific arrangement of the first and second electrodes may vary according to their purpose.

Figure 3:
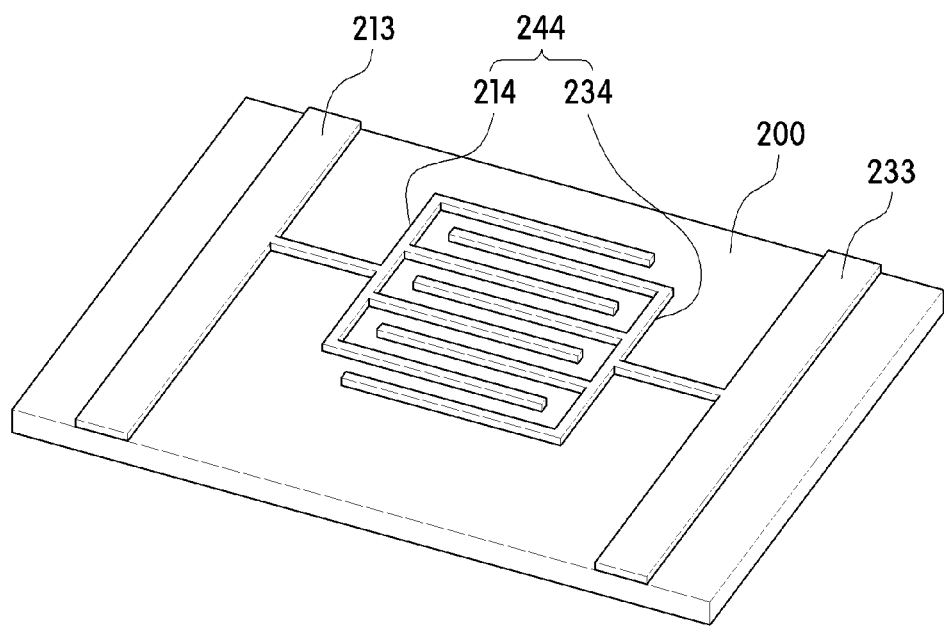
FIG. 3 is a perspective view of the electrode line including a first electrode and a second electrode which are disposed on a base substrate according to an embodiment of the present invention.

FIG. 3 is a perspective view of the electrode line including a first electrode and a second electrode which are formed on a base substrate according to an embodiment of the present invention. Here, the first electrode 213 may be disposed on the base substrate 200. The term "on the base substrate" may denote a state in which at least one of the first and second electrodes is directly disposed on a surface of the base substrate or is disposed to be spaced apart from an upper portion of the base substrate.

In detail, in FIG. 3, all of first electrodes 213 and 214 and second electrodes 233 and 234 are directly disposed on a surface of a base substrate 200 to form an electrode line 244 on which the first and second electrodes 214 and 234 are interdigitally disposed to be spaced apart from each other on the same plane.

Figure 4:
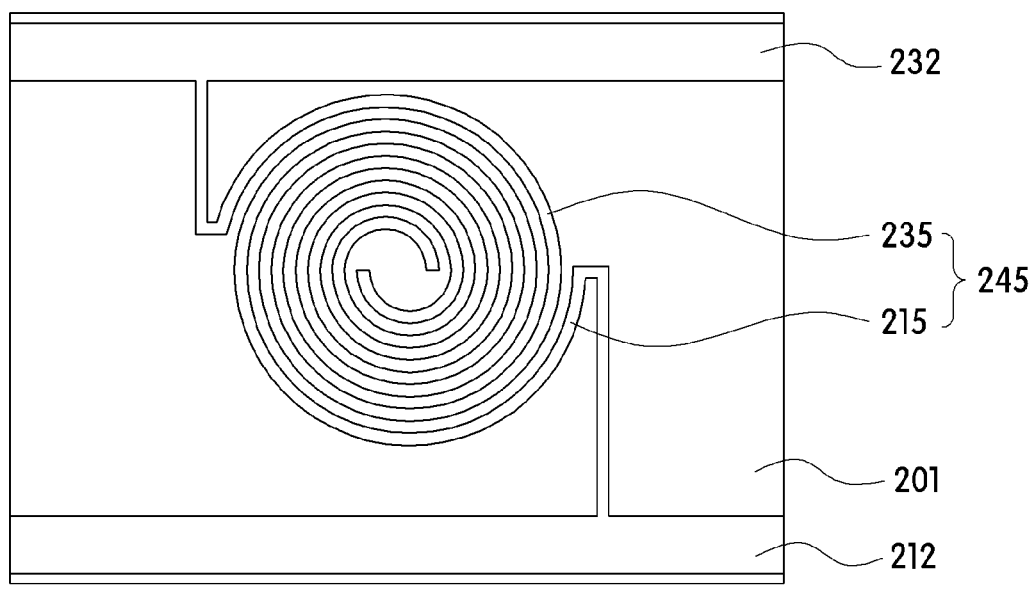
FIG. 4 is a plan view of the electrode line including the first electrode and the second electrode which are disposed on the base substrate according to an embodiment of the present invention.

FIG. 4 is a plan view of the electrode line including the first electrode and the second electrode which are disposed on the base substrate according to an embodiment of the present invention. Here, all of first electrodes 212 and 215 and second electrodes 232 and 235 are directly disposed on a surface of a base substrate 201 to form an electrode line 245 on which the first and second electrodes 214 and 234 are spirally disposed to be spaced apart from each other on the same plane.

When the electrode lines are interdigitally or spirally disposed, the nano-scale LEDs provided on the base substrates 200 and 201, each of which has a limited region, may be arranged at once to increase an operating area of a unit electrode that is independently operable, thereby increasing the number of nano-scale LEDs mounted on the unit electrode. Thus, since intensity of light emitted from the LED per the unit area increases, the LED may be applicable for various photo electronic devices that require high brightness.

FIGS. 3 and 4 are merely one embodiment, and thus the present invention is not limited thereto. For example, the two electrodes may be disposed in various shapes so as to be spaced a predetermined distance from each other.

Also, unlike the electrode line of FIG. 3 according to an embodiment of the present invention, according to another embodiment of the present invention, the second electrode may be disposed to be spaced apart from an upper portion of the base substrate.

Figure 5:
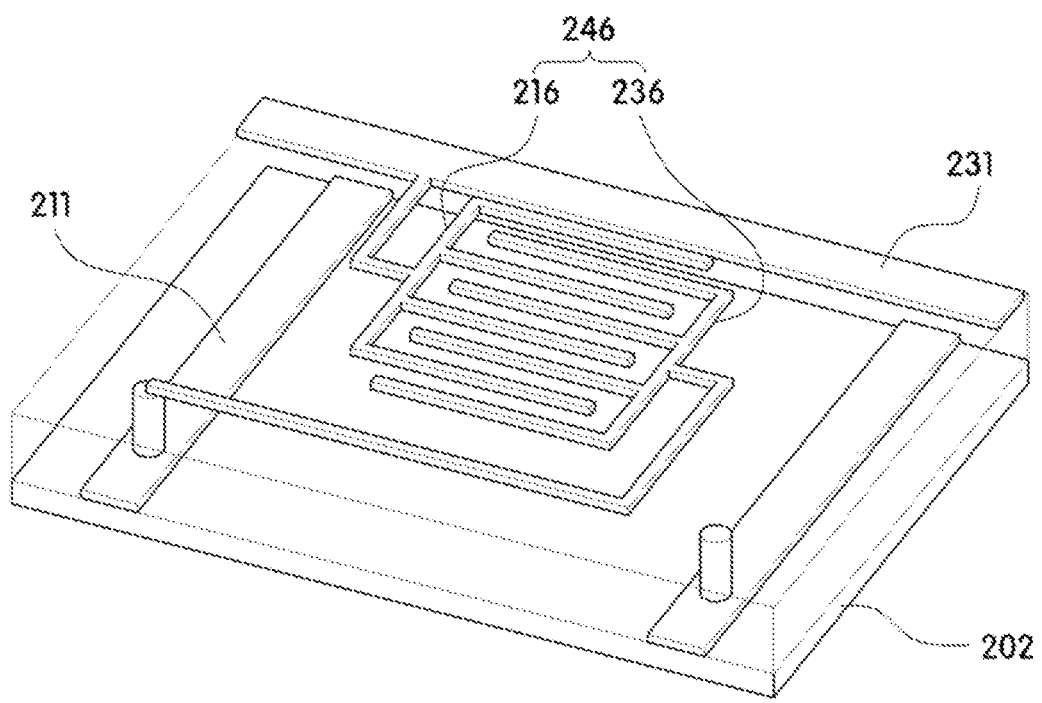
FIG. 5 is a perspective view of the electrode line including the first electrode and the second electrode which are disposed on the base substrate according to an embodiment of the present invention.

FIG. 5 is a perspective view of the electrode line including the first electrode and the second electrode which are disposed on the base substrate according to an embodiment of the present invention. Here, a first electrode 211 may be directly disposed on a surface of a base substrate 202, and second electrodes 231 and 236 are disposed to be spaced apart from an upper portion of the base substrate 202. A first electrode 216 is connected to the first electrode through a connection electrode and disposed to be spaced apart from the first electrode 211 on the base substrate 202 to form an electrode line 246 on which the first' electrode 216 and the second electrode 236 are interdigitally disposed on the same plane and spaced apart from each other.

Hereinafter, the shape in which the first and second electrodes are interdigitally disposed on the same plane will be described. However, the first and second electrodes may be directly disposed on the surface of the base substrate or spaced apart from the surface of the base substrate, and the first electrode may be disposed on a plane different from that of the second electrode.

Next, a solution (see reference numerals 120 and 140 of FIG. 1A) containing the nano-scales LED devices will be described.

The solution (see reference numerals 120 and 140 of FIG. 1A) containing the nano-scales LED devices may be manufactured by mixing a plurality of nano-scale LED devices 120 with a solvent 140. The solution may have an ink or paste phase. For example, the solvent 140 may be one selected from the group consisting of acetone, water, alcohol, and toluene, more preferably, acetone. However, the present invention is not limited to the above-described kinds of solvent 140. If the solvent 140 is well vaporized without having a physical and chemical influence on the nano-scale LED device 120, the solvent 140 is not limited in kind.

The nano-scale LED devices may be contained in about 0.001 weight parts to about 100 weight parts with respect to 100 weight parts of solvent. If the nano-scale LED devices are contained in about 0.001 weight parts or less, the number of nano-scale LED devices connected to the electrode may be low, and thus, it may be difficult to exert normally functions of the nano-scale LED electrode assembly. To solve this limitation, the solution has to be added several times. On the other hand, if the nano-scale LED devices are contained in about 100 weight parts or more, it may be difficult to align the nano-scale LED devices without interfering.

The nano-scale LED device will be described. The nano-scale LED device that is capable of being used in the present invention is not limited if the nano-scale LED device is capable of being used for lightings or displays. For example, the nano-scale LED device in the step (1) may have a length of about 100 nm to about 10 μm, preferably, about 500 nm to about 5 μm. If the nano-scale LED device has a length of about 100 nm or less, it may be difficult to manufacture an LED device having high efficiency. On the other hand, if the nano-scale LED device has a length of about 10 μm or more, light efficiency of the LED device may be deteriorated. The nano-scale LED device may have various shapes such as a cylindrical shape and a rectangular parallelepiped shape, preferably, the cylindrical shape, but is not limited thereto.

Hereinafter, in the description of the nano-scale LED device, the terms "above", "below", "left", "right", "upper", and "lower" may denote vertical upper and lower directions with respect to each layer included in the nano-scale LED device.

The nano-scale LED device includes a first electrode layer; a first conductive type semiconductor layer disposed on the first electrode layer; an active layer disposed on the first conductive type semiconductor layer; a second conductive type semiconductor layer disposed on the active layer; and a second electrode layer disposed on the second conductive type semiconductor layer.

Figure 6:
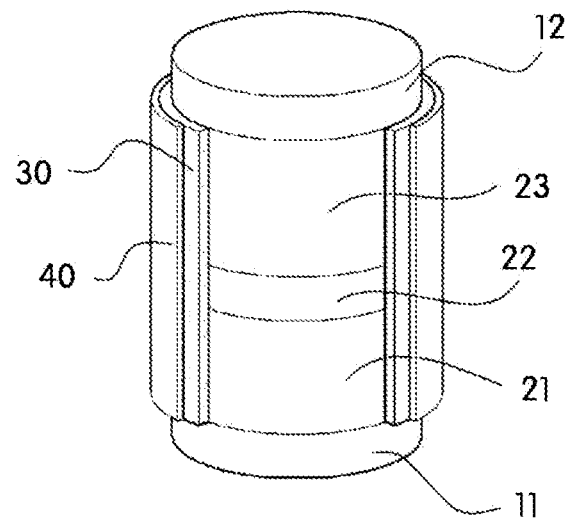
FIG. 6 is a perspective view of a nano-scale LED device according to an embodiment of the present invention.

FIG. 6 is a perspective view of a nano-scale LED device according to an embodiment of the present invention. Here, the nano-scale LED device includes an active layer 22 disposed on a first conductive type semiconductor layer 21 disposed on a first electrode layer 11, a second conductive type semiconductor layer disposed on the active layer 22, and a second electrode layer 12 disposed on the second conductive type semiconductor layer 23.

First, the first electrode layer 11 will be described.

The first electrode 11 may be formed of metal or metal oxide that is used for an electrode of a general LED device. For example, the first electrode 11 may be formed of one or mixture of chrome (Cr), titanium (Ti), aluminum (Al), gold (Au), nickel (Ni), ITO, and oxide or alloy thereof, but is not limited thereto. For example, the first electrode layer may have a thickness of about 1 nm to about 100 nm, but is not limited thereto. If the first electrode layer is provided, the first semiconductor layer and the electrode line may be connected to each other at a relatively low temperature when compared to a required temperature in a process of forming a metal ohmic layer at a connection portion between the first semiconductor layer and the electrode line.

Next, the first conductive type semiconductor layer 21 disposed on the first electrode layer 11 will be described. For example, the first conductive type semiconductor layer 21 may include an N-type semiconductor layer. When the nano-scale LED device is a blue light emitting device, the n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AN, and InN. Also, the first conductive semiconductor layer may be doped with a first conductive type dopant (e.g., Si, Ge, or Sn). For example, the first conductive type semiconductor layer 21 may have a thickness of about 500 nm to about 5 μm, but is not limited thereto. The light color of the nano-scale LED is not limited to the blue color. If the light color is different, different kinds of III-V group semiconductor materials may be used for the n-type semiconductor layer.

Next, the active layer 22 disposed on the first conductive semiconductor layer 21 will be described. If the nano-scale LED device is a blue light emitting device, the active layer 22 may be disposed on the first conductive type semiconductor layer 21 and have a single or multi quantum well (MQW) structure. A clad layer (not shown) which is doped with a conductive dopant may be disposed on and/or under the active layer 22. The clad layer doped with the conductive dopant may be realized as an AlGaN layer or an InAlGaN layer. In addition, materials such as AlGaN and AlInGaN may be used for the active layer 12. When electric fields are applied to the active layer 22, light may be generated due to coupling of electron-hole pairs. For example, the active layer may have a thickness of about 10 nm to about 200 nm, but is not limited thereto. The active layer may be disposed at various positions according to kinds of LEDs. The light color of the nano-scale LED is not limited to the blue color. If the light color is different, different kinds of III-V group semiconductor materials may be used for the active layer.

Next, the second conductive semiconductor layer 23 disposed on the active layer 22 will be described. When the nano-scale LED device is a blue light emitting device, the second conductive type semiconductor layer 23 is disposed on the active layer 22, and the second conductive type semiconductor layer 23 may be realized as at least one p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN. Also, the second conductive semiconductor layer may be doped with a second conductive type dopant (e.g., Mg). Here, a light emitting structure may include the first conductive type semiconductor layer 21, the active layer 22, and the second conductive type semiconductor layer 23 as minimum components. Also, the light emitting structure may further include the other phosphor layer, active layer, semiconductor layer, and/or electrode layer above/below each layer. For example, the second conductive type semiconductor layer 23 may have a thickness of about 50 nm to about 500 nm, but is not limited thereto. The light color of the nano-scale LED is not limited to the blue color. If the light color is different, different kinds of III-V group semiconductor materials may be used for the p-type semiconductor layer.

Next, the second electrode layer 12 disposed on the second conductive semiconductor layer 23 will be described.

The second electrode 12 may be formed of metal or metal oxide that is used for an electrode of a general LED device. For example, the first electrode 11 may be formed of one or mixture of chrome (Cr), titanium (Ti), aluminum (Al), gold (Au), nickel (Ni), ITO, and oxide or alloy thereof, but is not limited thereto. For example, the first electrode layer may have a thickness of about 2 nm to about 100 nm, but is not limited thereto. If the second electrode layer is provided, the second semiconductor layer and the electrode line may be connected to each other at a relatively low temperature when compared to a required temperature in a process of forming a metal ohmic layer at a connection portion between the first semiconductor layer and the electrode line.

The nano-scale LED device provided in the nano-scale LED electrode assembly according to the present invention includes an insulation film 30 covering the whole outer surface of a portion of at least active layer on an outer surface of the nano-scale LED device to prevent the active layer 22 of the nano-scale LED device and the electrode line provided in the nano-scale LED electrode assembly from contacting each other to cause electrical short-circuit.

Also, the insulation film 30 may be applied to at least one outer surface of the first and second semiconductor layers 21 and 23 to prevent durability of the nano-scale LED device from being deteriorated due to the electrical short-circuit and damage of the outer surface of the semiconductor layer.

In FIG. 6, the insulation film 30 covers the outer surfaces of the first conductive type semiconductor layer 21, the active layer 22, and the second conductive type semiconductor layer 23.

The insulation film 30 may prevent the electrical short-circuit occurring when the active layer of the nano-scale LED device contacts the electrode from occurring. Also, the insulation layer 30 may protect the outer surface in addition to the active layer of the nano-scale LED device to prevent the outer surface defects of the device from occurring, thereby to prevent light emitting efficiency from deteriorated.

If each of the nano-scale LED devices is disposed and connected one by one between two electrodes different from each other, the electrical short-circuit occurring due to the contact between the active layer and the electrodes may be prevented. However, it may be difficult to physically mount the nano-scale LED device having the nano unit one by one on the electrode. Thus, when power is applied to self-align the nano-scale LED devices between the two electrodes different from each other, the nano-scale LED device may be changed in position through movement and alignment between the two electrodes different from each other. In this process, the active layer 22 of the nano-scale LED device may contact the electrode line to frequently cause the electrical short-circuit.

If the nano-scale LED device stands up on the electrode, the electrical short-circuit occurring due to the contact between the active layer and the electrode line may be prevented. That is, when the nano-scale LED device does not stand up on the electrode, but lies on the electrode, the contact between the active layer and the electrode line may occur. In this case, it may be difficult to connect the nano-scale LED device between the two electrodes different from each other, and also, the electrical short-circuit may occur.

Figure 7:
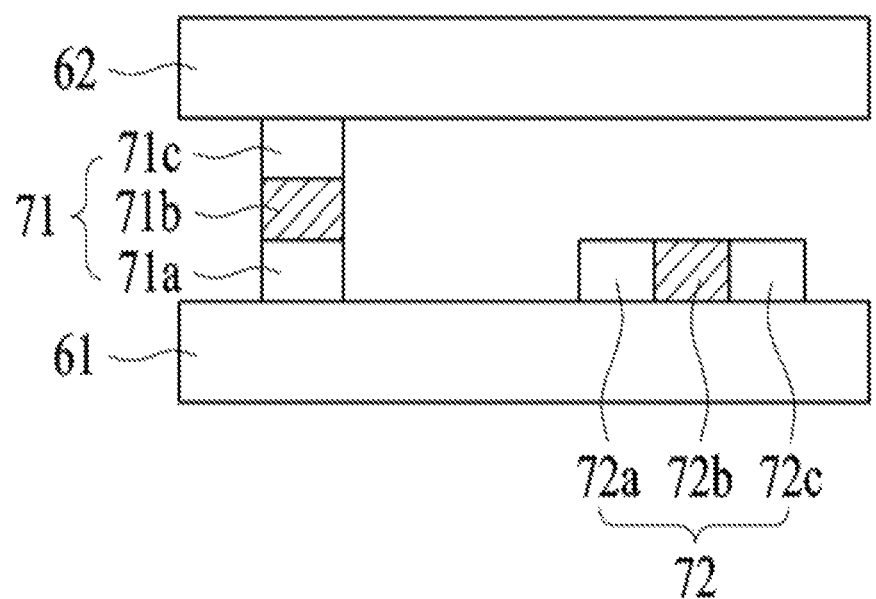
FIG. 7 is a vertical cross-sectional view of a nano-scale LED electrode assembly according to a related art.

FIG. 7 is a vertical cross-sectional view of the nano-scale LED electrode assembly according to the related art. In FIG. 7, it is seen that a first semiconductor layer 71a of a first nano-scale LED device 71 is connected to a first electrode line 61, a second semiconductor layer 71c is connected to a second electrode line 62, and the first nano-scale LED device 71 stands up and is connected between two electrodes 61 and 62. If the nano-scale LED device 71 is connected to both the two electrodes in the electrode assembly of FIG. 7, an active layer 71b of the device may not contact one of the two electrodes 61 and 62 to prevent the electrical short-circuit due to the contact between the active layer 71b and the two electrodes 61 and 62 from occurring.

On the other hand, the second nano-scale LED device 72 may lie on the first electrode 61 in FIG. 7. In this case, the active layer 72b of the second nano-scale LED device 72 may contact the first electrode 61. Here, the second nano-scale LED device 72 may not be connected to the first and second electrodes 61 and 62. However, the electrical short-circuit may not occur. Thus, if the insulation film is applied to the outer surfaces of the first semiconductor layer 71a, the active layer 71b, and the second semiconductor layer 71c of the first nano-scale LED device 71 provided in the electrode assembly as illustrated in FIG. 7, the insulation film may have only a purpose and effect of the reduction of the light emitting efficiency by preventing the outer surface of the nano-scale LED device from being damaged.

However, unlike the nano-scale electrode assembly of FIG. 7 according to the related art, according to the present invention, the two electrodes different from each other may be disposed to be spaced apart from each other (see FIG. 3). Also, since the nano-scale LED device is connected in the laid state parallel to the same plane as the two electrodes, the electrical short-circuit occurring due to the contact between the active layer of the nano-scale LED device and the electrodes may occur even though the electrical short-circuit does not occur in the nano-scale LED device according to the related art. Thus, to prevent the above-described short-circuit, it may be necessary to form the insulation film covering the outer surface of a portion of at least the active layer on the outer surface of the nano-scale LED device.

Furthermore, like the nano-scale LED device provided in the nano-scale electrode assembly according to the present invention, the active layer may be necessarily exposed to the outside in the nano-scale LED device having the structure in which the first semiconductor layer, the active layer, the second semiconductor layer are successively and vertically arranged. Also, in the LED device having the above-described structure, the active layer may not be disposed at only a center in a longitudinal direction of the device, but be disposed toward a specific semiconductor layer to increase possibility of the contact between the electrode and the active layer. Thus, the insulation film may electrically connect the device to the two electrodes different from each other regardless of the position of the active layer to achieve the purpose of the present invention. As a result, the insulation film may be necessary.

Figure 8:
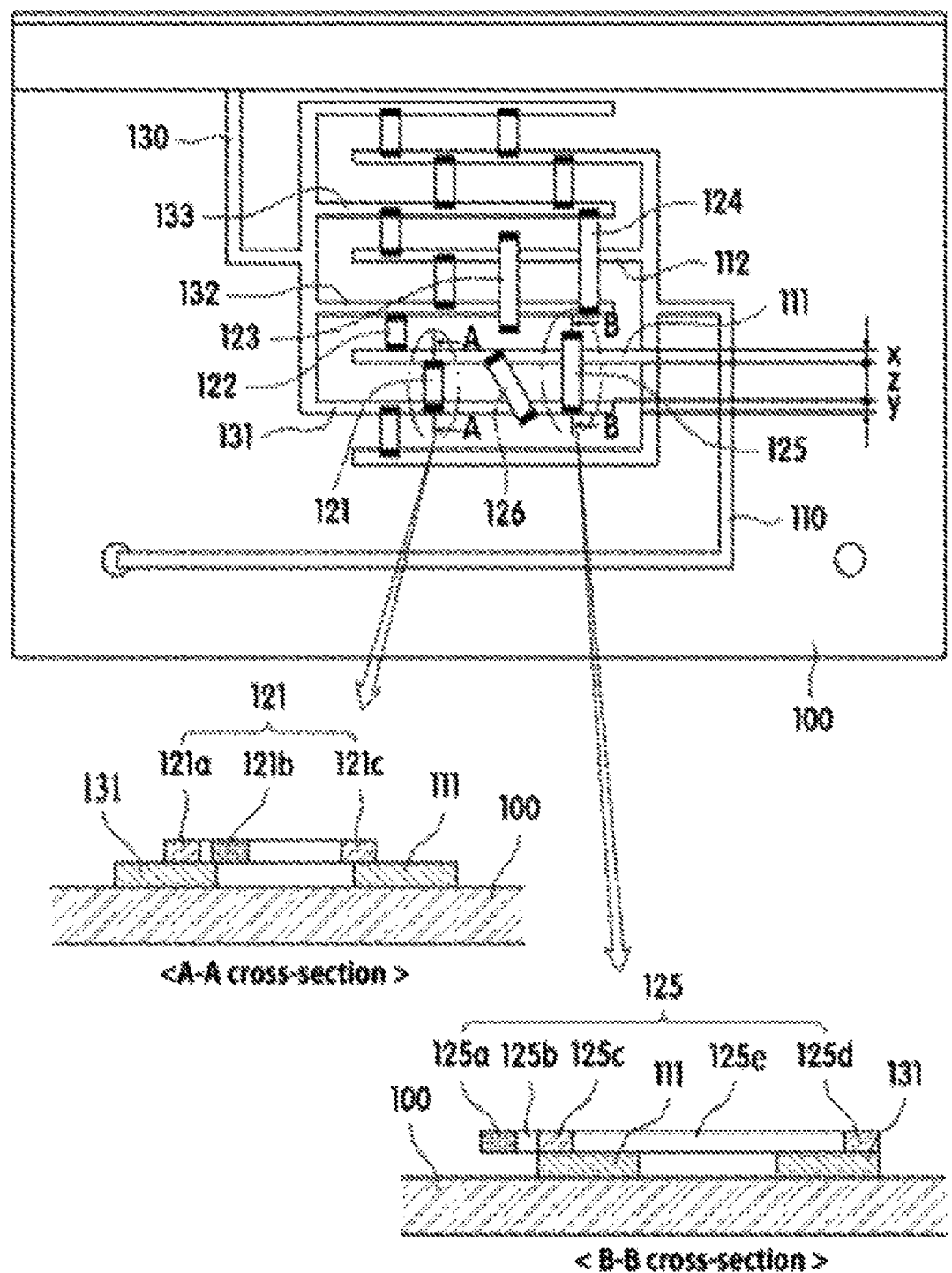
FIG. 8 is a plan and vertical cross-sectional view of the nano-scale LED device connected to the first and second electrodes according to an embodiment of the present invention.

FIG. 8 is a plan and vertical cross-sectional view of the nano-scale LED device connected to the first and second electrodes according to an embodiment of the present invention. Particularly, as illustrated in the cross-sectional view taken along line A-A in FIG. 8, the nano-scale LED device includes a first electrode layer 121*a*, an active layer 121*b* and a second electrode layer 121*c*, the active layer 121*b* of nano-scale LED devices 121 may not be disposed at a central portion of the nano-scale LED device 121, but be disposed toward a left side. In this case, possibility of contact between a portion of the active layer 121*b* and an electrode may increase to cause an electrical short-circuit. This may cause defects of the nano-scale LED electrode assembly. To solve the above-described limitation, an outer surface of the nano-scale LED device of the present invention in addition to a portion of the active layer may be coated with an insulation film. Thus, even though the active layer 121*b* is disposed between the two electrodes, like the first nano-scale LED device 121 of FIG. 8, the electrical short-circuit may be prevented due to the insulation film.

The insulation film 30 may be formed of one of silicon nitride ($Si_3N_4$), silicon dioxide ($SiO_2$), aluminum oxide ($Al_2O_3$), hafnium oxide ($HfO_2$), yttrium oxide ($Y_2O_3$), and titanium oxide ($TiO_2$). For example, the insulation film 30 may be formed of a transparent material including the above-described component, but is not limited thereto. In case of the transparent insulation film, the insulation film 30 may have its original function and the coating function to minimize the reduction of the light emitting efficiency that may rarely occur.

According to an embodiment of the present invention, the insulation film 30 may not be applied to at least one of the first and second electrode layers 11 and 12 of the nano-scale LED device, preferably, may not be applied to all of the first and second layers 11 and 12. Here, the two electrode layers 11 and 12 have to be electrically connected to the electrodes different from each other, respectively. When the insulation film 30 is applied to the two electrodes 11 and 12, the electrical connection therebetween may be interrupted to reduce intensity of light emitted from the LED device or may not occur so that light is not emitted. However, when the two electrode layers 11 and 12 of the nano-scale LED device are electrically connected to the electrodes different from each other, there is no problem in emission of the LED device, and thus, the insulation film 30 may be applied to the rest electrode layers 11 and 12 except for ends of the two electrode layers 11 and 12 of the nano-scale LED device.

According to an embodiment of the present invention, the nano-scale LED device may further include a hydrophobic film 40. The hydrophobic film 40 may provide a hydrophobic property on the surface of the nano-scale LED device to prevent the LED devices from being aggregated. When the nano-scale LED device is mixed with a solvent, the aggregation between the nano-scale LED devices may be minimized to remove the reduction in characteristic of the independent nano-scale LED device. Also, when power is applied to the electrode line, the nano-scale LED devices may be more easily aligned in position.

The hydrophobic film 40 may be disposed on the insulation film 30. In this case, the hydrophobic film is not limited, if the hydrophobic film is disposed on the insulation film to prevent the nano-scale LED devices from being aggregated. The hydrophobic film may be formed of one or mixture of self-assembled monolayers (SAMs) such as octadecyl-trichlorosilane, (OTS), fluoroalkyltrichlorosilane, and (perfluoroalkyltriethoxysilane) and fluoropolymer such as Teflon and cytop, but is not limited thereto.

The nano-scale LED device provided in the nano-scale LED electrode assembly according to the present invention may have a length that satisfies following relation expression 1 to electrically connect the nano-scale LED device to the two electrodes different from each other. If the nano-scale LED device and the two electrodes are not electrically connected to each other, even though power is applied to the electrode line, the nano-scale LED device may not emit light because the nano-scale LED device and the two electrodes are not electrically connected to each other.

[Relation Expression 1]

The relation expression 1 may be expressed as follows: $0.5Z \leq H < X+Y+2Z$. Here, the relation expression 1 may satisfy $Z \leq H < X+Y+2Z$, more preferably, $Z \leq H \leq X+Y+Z$ (where 100 nm $\langle X \leq 10$ μm, 100 nm $\langle Y \leq 10$ μm, 100 nm $\langle Z \leq 10$ μm, relation expression 2). The reference symbol X denotes a width of the first electrode included in the electrode line, and the reference symbol Y denotes a width of the second electrode. The reference symbol Z denotes a distance between the first electrode and the second electrode adjacent to the first electrode, and the reference symbol H denotes a length of the nano-scale LED device. Here, if each of the first and second electrodes is provided in plurality, the distances Z between the two electrodes may be equal to or different from each other.

A portion of the nano-scale LED device, which is electrically connected to the two electrodes different from each other may be at least one layer (or one of the second conductive type semiconductor layer and the second electrode layer) of the first electrode layer and the first conductive type semiconductor layer of the nano-scale LED device.

If the nano-scale LED device has a length that is significantly less than the distance between the two electrodes different from each other, it may be difficult to connect the nano-scale LED device to both the two electrodes. Thus, the nano-scale LED device may be a nano-scale LED device having a length H that satisfies a condition of $0.5Z \leq H$ in the relation expression 1. If the nano-scale LED device has the length H that does not satisfy the condition of $0.5Z \leq H$ in the relation expression 1, the nano-scale LED device may not be electrically connected to the first and second electrodes, but be electrically connected to only one of the first and second electrodes. In detail, as illustrated in FIG. 8, since a second nano-scale LED device 122 may be inserted and electrically connected between the first and second electrodes 111 and 131, the nano-scale LED device according to the present invention may be an LED device that satisfies a condition of $Z \leq H$ in the relation expression 2.

When the nano-scale LED device has a length H that increases in consideration of the width X of the first electrode, the width Y of the second electrode, and the distance Z between the first and second electrodes, a portion of the nano-scale LED device except for both ends thereof may be independently connected to each of the first and second electrodes 112 and 132, but a third nano-scale LED device 123 of FIG. 8. If the active layer of the third nano-scale LED device 123 is not disposed at the central portion of the device, and the insulation film covering the outer surface of a portion of at least the active layer is not applied to the outer surface of the device, the electrode 112 or 132 and the third nano-scale LED device may be electrically short-circuited. However, the nano-scale LED device according to the present invention includes the insulation film covering the whole outer surface of the portion of at least the active layer on the outer surface thereof. Thus, like the third nano-scale LED device 123 of FIG. 8, even though the portion of the nano-scale LED device except for both ends thereof is connected to the electrode, the nano-scale LED device may be electrically connected to the electrode without causing the electrical short-circuit.

However, since the nano-scale LED device has the length H that increases in consideration of the width X of the first electrode, the width Y of the second electrode, and the distance Z between the first and second electrodes, if a condition of H<X+Y+2Z in the relation expression 1 is not satisfied, the nano-scale LED device that is not electrically connected may be provided in the nano-scale LED electrode assembly.

In detail, a fourth nano-scale LED device 124 of FIG. 8 may be connected to the two electrodes 132 and 133 and one first electrode 112 at the same time. In this case, the nano-scale LED device may have a length that does not satisfy a condition of H<X+Y+2Z in the relation expression 1. In the nano-scale LED device, since the insulation film is applied to the outer surface of the active layer, the electrical short-circuit due to the contact between the second electrodes 132 and 133 or the first electrode 112 and the active layer may be solved. However, since both ends of the nano-scale LED device 124 are connected to the two second electrodes 132 and 133, the electrical connection therebetween may not be substantially performed. Thus, the fourth nano-scale LED device of FIG. 4 may not emit light even though power is applied to the electrode line.

Also, the nano-scale LED device may have a length H that is greater than that of the fourth nano-scale LED device 124. Thus, even though ends of the nano-scale LED device are electrically connected to the first and second electrodes 111 and 133, if the length of the nano-scale LED device increases, the light efficiency may be deteriorated, and thus, the desired nano-scale LED electrode assembly may not be manufactured. Thus, to solve the above-described limitations, the nano-scale LED device may have a length H that satisfies a condition of H<X+Y+2Z in the relation expression 1.

However, if the active layer of the nano-scale LED device is disposed toward the conductive type semiconductor layer (see reference numeral 156b of FIG. 8), and the portion of the nano-scale LED device connected to the electrode is the active layer that is coated with the insulation film, but the electrode layer and/or the conductive type semiconductor layer, although the electrical short-circuit does not occur by the insulation film, the nano-scale LED device may not be electrically connected to the electrode line.

Particularly, in FIG. 8, a fifth nano-scale LED device 125 may be connected to both the first and second electrodes 111 and 131. And in the cross-sectional view taken along line B-B in FIG. 8, the fifth nano-scale LED device 125 includes a first electrode layer 125a, a first conductive type semiconductor layer 125b, an active layer 125c, a second conductive type semiconductor layer 125e, and a second electrode layer 125d. However, in the cross-sectional view taken along line B-B in FIG. 8, it is seen that a portion of the fifth nano-scale LED device 125 connected to the first electrode 111 is a portion of the active layer 125c coated with the insulation film, and the first electrode layer 125a and the first conductive type semiconductor layer 125b is not connected to the first electrode 111. Since the fifth nano-scale LED device is coated with the insulation film on the outer surface of the portion of the active layer 125c, although the electrical short-circuit does not occur, the first electrode layer 125a and the first conductive type semiconductor layer 125b may not be connected to the first electrode 111. Thus, the nano-scale LED device 125 may not emit light when the power is applied to the electrode line.

Also, even though the nano-scale LED device has a length H that satisfies a condition of X+Y+Z<H<X+Y+2Z in the relation expression 1, and the nano-scale LED device is electrically connected, it may be difficult to realize the nano-scale LED electrode assembly emitting light having desired light intensity. Particularly, since a sixth nano-scale LED device 126 of FIG. 8 is electrically connected to the first and second electrodes 111 and 131, when power is applied to the electrode line, the nano-scale LED device 126 may emit light. However, since the nano-scale LED device 126 is obliquely mounted on the first and second electrodes 111 and 131, but is not vertically aligned with the first and second electrode 111 and 131, an area of the electrode line that is occupied by mounting the one nano-scale LED device may increase. Thus, the number of nano-scale LED devices that are capable of being mounted on the limited region of the electrode line may decrease, and it may be difficult to realize the nano-scale LED electrode assembly emitting light having the desired light intensity.

According to an embodiment of the present invention, the nano-scale LED device may have a length H that satisfies a condition H≤X+Y+Z in the relation expression 2. In this case, the nano-scale LED electrode assembly electrically connected without occurring the electrical short-circuit regardless of the position of the active layer coated with the insulation film in the longitudinal direction of the nano-scale LED device may be realized, and the area of the electrode line occupied by the one nano-scale LED device may decrease to increase the number of nano-scale LED devices to be mounted on the electrode line having the limited region, thereby easily realizing the desired LED electrode assembly.

The step (1) may includes: 1-1) manufacturing the electrode line including the base substrate, the first electrode formed on the base substrate, and a second electrode spaced apart from the first electrode on the same plane as the first electrode; 1-2) forming an insulation barrier surrounding an electrode line region on which the nano-scale LED device is mounted on the base substrate; and 1-3) injecting the solution containing the plurality of nano-scale LED devices to the electrode line region surrounded by the insulation barrier.

First, the step 1-1) may include a process of manufacturing a base substrate and an electrode line including a first electrode formed on the base substrate and a second electrode formed to be spaced apart from the first electrode on the same plane as the first electrode. Since the specific method for forming the electrode in the step 1-1) is previously described above, its detailed description will be omitted.

Next, the step 1-2) may include a process of forming an insulation barrier surrounding an electrode line region on which a nano-scale LED device is mounted on the base substrate.

When a solution containing the nano-scale LED device is injected to the electrode line in the step 1-3), the insulation barrier may prevent the solution containing the nano-scale LED device from being spread to a region except for an electrode line region on which the nano-scale LED device is mounted so that the nano-scale LED device is disposed on the desired electrode line region.

Although the insulation barrier is manufactured through a manufacturing process that will be described below, the present invention is not limited to the method for the insulation barrier.

Figure 9:
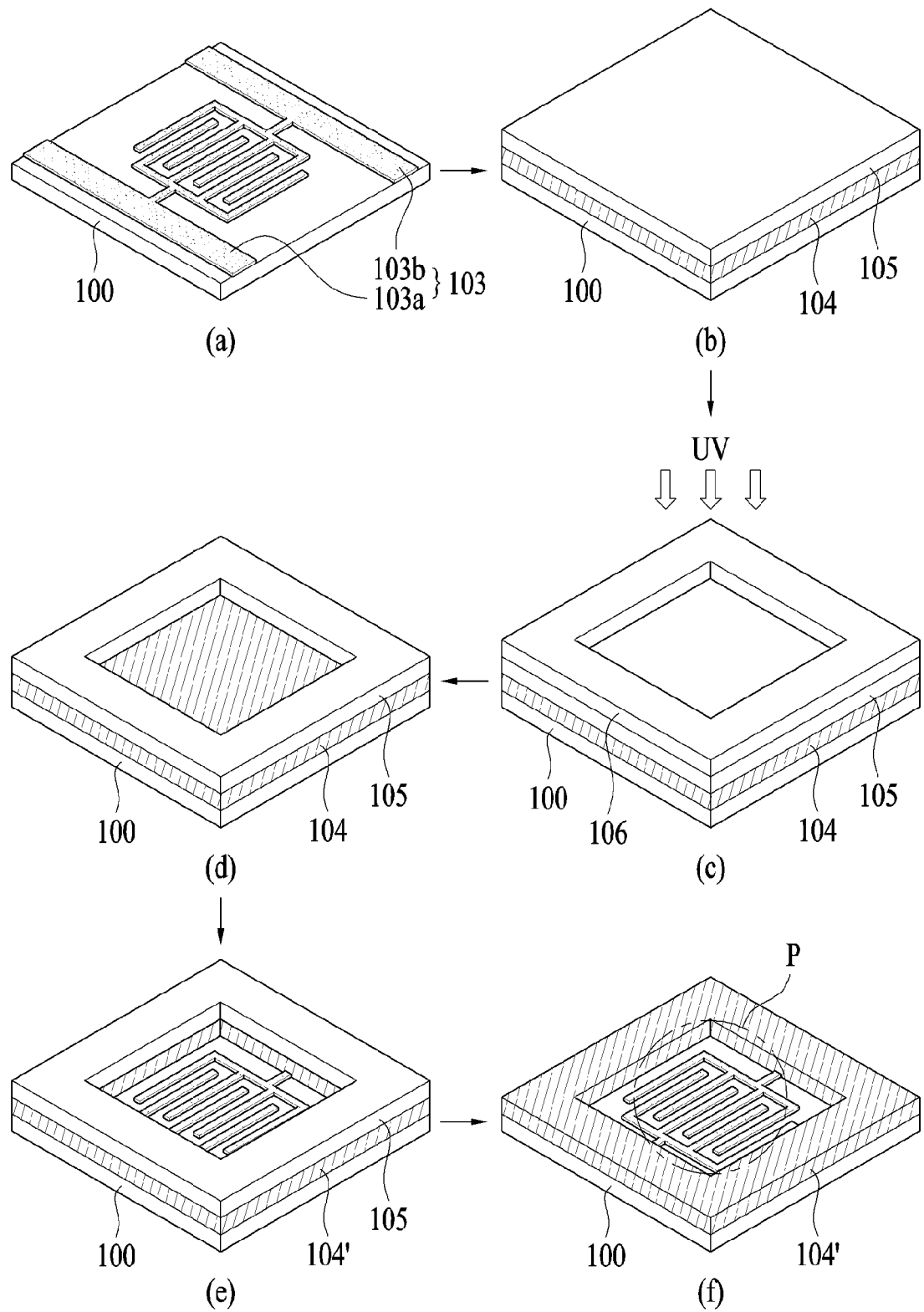
FIG. 9 is a perspective view illustrating a process of manufacturing an insulation barrier on the base substrate according to an embodiment of the present invention.

FIG. 9 is a view illustrating a process of manufacturing a base substrate 100 and an insulation barrier 104' on an electrode line formed on the base substrate 100. As illustrated in FIG. 2F, electrode lines 103a and 103b deposited on the base substrate 100 may be manufactured, and then, the insulation barrier 104' may be manufactured.

First, the base substrate 100 may be formed as illustrated in FIG. 9A, and an insulation layer 104 may be formed on the electrode lines 103a and 103b formed on the base substrate 100 as illustrated in FIG. 9B. The insulation layer 104 may be a layer for forming the insulation barrier after following processes are performed. The insulation layer 104 may be formed of an insulation material that is generally used in the ordinary skilled in the part, preferably, one of inorganic materials such as silicon nitride ($Si_3N_4$), silicon dioxide ($SiO_2$), aluminum oxide ($Al_2O_3$), hafnium oxide ($HfO_2$), yttrium oxide ($Y_2O_3$), and titanium oxide ($TiO_2$) and various transparent polymer insulation materials. A method for forming the insulation layer 104 by applying an inorganic insulation layer on the base substrate 100 and the electrode lines 103a and 103b formed on the base substrate 100 may use one of a chemical vapor deposition method, an atomic layer deposition method, a vacuum deposition method, an E-beam deposition method, and a spin coating method, preferably, the chemical vapor deposition method, but is not limited thereto. Also, a method for applying the polymer insulation layer may use one of a spin coating method, a spray coating method, and a screen printing method, preferably, the spin coating method, but is not limited thereto. A specific coating method may be performed by the method that is well-known in the ordinary skilled in the art. The applied insulation layer 104 may have a thickness that corresponds to a half or more of a diameter of the nano-scale LED device so that the nano-scale LED device does not overflow and have an influence on the following processes. Generally, the insulation layer 104 may have a thickness of about 0.1 μm to about 100 μm, which does not have an influence on the following processes, preferably, about 0.3 μm to about 10 μm. If the above-described range is not satisfied, it may be difficult to manufacture products including the nano-scale LED electrode assembly because the insulation layer has an influence on the following processes. If the insulation layer has a thickness that is too thinner than a diameter of the nano-scale LED device, the prevention in spreading of the nano-scale LED device through the insulation barrier may be insufficient to cause the phenomenon in which the solution containing the nano-scale LED device may overflow to the outside of the insulation barrier.

Thereafter, a photo resist (PR) 105 may be applied on the insulation layer 104. The photo resist 101 may be a photo resist that is generally used in the ordinary skilled in the art. The method for applying the photo resist on the insulation layer 104 may include one of the spin coating method, the spray coating method, and the screen printing method. Preferably, the spin coating method is used, but is not limited thereto. A specific coating method may be performed by the method that is well-known in the ordinary skilled in the art. The applied photo resist 105 may have a thickness that is slightly thicker than that of the insulation layer applied to a mask that is used for an etching process. Thus, the photo resist 105 may have a thickness of about 1 μm to about 20 μm. However, the photo resist 105 for coating may have a thickness that is variable in consideration of a purpose thereof.

After the photo resist 105 is formed on insulation layer 104 as described above, a mask 106 having a shape corresponding to a horizontal cross-section of the insulation barrier is placed on the photo resist 105 as illustrated in FIG. 9C and then be exposed to UV rays that are irradiated from an upper side of the mask 106.

Thereafter, the photo resist that is exposed may be immersed into a general photo resist solvent and then removed. Thus, as illustrated in FIG. 9D, a portion of the exposed photo resist layer on which the electrode line on which the nano-scale LED device is mounted may be removed.

Next, the photo resist layer may be removed to perform a process of removing the portion of the insulation layer, which is exposed through etching of the exposed insulation layer. The etching may be performed through wet etching or dry etching, preferably, the dry etching. A specific method for performing the etching process may be performed through a method that is well known in the ordinary skilled in the part. The dry etching may include at least one of plasma etching, sputter etching, reactive ion etching, and reactive ion bean etching. However, the specific etching method is not limited to the above-described materials. When the exposed insulation layer is removed through the etching, the base substrate 100 and the electrode lines 103a and 103b may be exposed as illustrated in FIG. 9E.

Next, as illustrated in FIG. 9F, when the photo resist 105 applied on the base substrate 100 is removed by using one photo resist stripper of 1-methyl-2-pyrrolidone (NMP) and dimethyl sulfoxide (DMSO), an insulation barrier 104' may be formed on a region except for a region on which the nano-scale LED device is substantially mounted on the base substrate 100.

Next, a step 1-3) may include a process of injecting a solution containing a plurality of nano-scale LED devices on an electrode line region surrounded by the insulation barrier.

Figure 10:
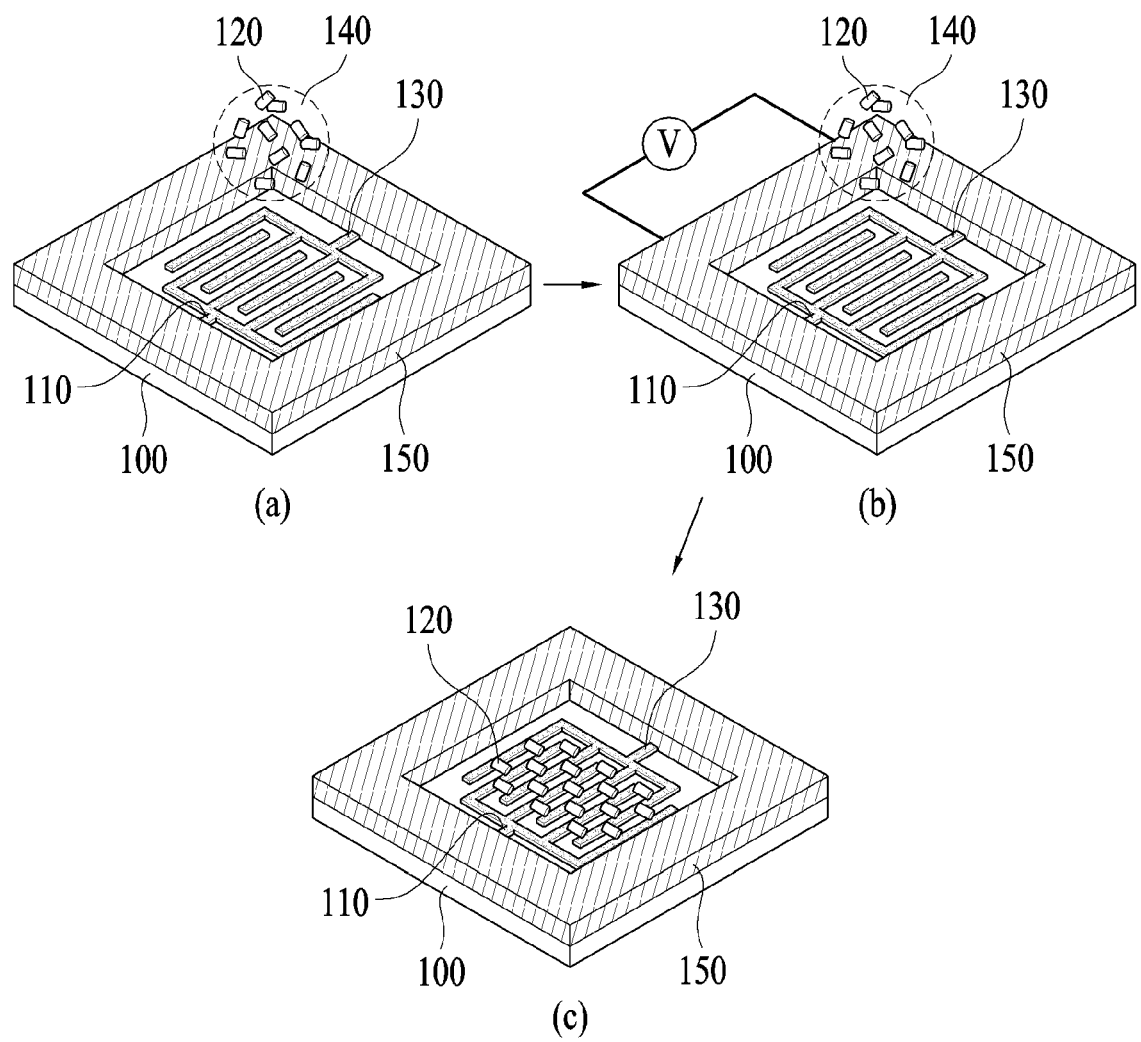
FIG. 10 is a perspective view illustrating a process of manufacturing the nano-scale LED electrode assembly according to the first embodiment of the present invention.

Particularly, FIG. 10 is a perspective view illustrating a process of manufacturing the nano-scale LED electrode assembly according to an embodiment of the present invention. As illustrated in FIG. 10A, a solution 120 and 140 containing the plurality of nano-scale LED devices may be injected to regions of the electrode line 110 and 130 surrounded by the insulation barrier 150 formed on the base substrate 100. In this case, when compared to the case of FIG. 1A, the solution containing the nano-scale LED device may be directly injected to the desired electrode line region. Also, it may prevent the nano-scale LED device from being spread to the outside of the electrode lines after the solution is injected so that the nano-scale LED device to be mounted is disposed on the undesired electrode line region and/or a region on which the electrode lines are not provided. Descriptions with reference to FIGS. 10B and 10C may be previously described in those with reference to FIGS. 1B and 1C in the step (2) according to the present invention, and thus, their descriptions will be omitted.

Next, according to the first embodiment of the present invention, the step (2) may include a process of applying power to the electrode line to self-align the plurality of nano-scale LED devices to connect the plurality of nano-scale LED devices to first and second electrodes.

The plurality of nano-scale LED devices provided in the plurality of nano-scale LED assembly according to the present invention may be self-aligned by applying the power to the first and second electrodes and then be connected to both of the first and second electrodes.

In case of the general LED device, the LED device may be directly and physically disposed and connected to both of different electrodes that are spaced apart from each other on the same plane. For example, the general LED device may be manually arranged in a laid state between the different electrodes of a planar electrode.

However, it may be difficult to physically locate the nano-scale LED device according to the present invention, and thus, the nano-scale LED device may not be connected to both of the nano-scale electrodes spaced apart from each other on the same plane. Also, when the nano-scale LED device has a cylindrical shape, if the nano-scale LED device is only injected into the electrodes, the nano-scale LED devices may not be self-aligned and be rolled on the electrodes. Thus, the power may be applied to the electrode line to connect the nano-scale LED devices to both of two electrodes different from each other, thereby solving the above-described limitation.

The power may be variable power having a predetermined amplitude and period and also be a sine wave or pulse wave having a wave form except for the sine wave. For example, AC power may be applied, or DC power of 0 V, 30 V, 0 V, 30 V, 0 V, and 30 V may be repeatedly applied to the first electrode 1,000 times, and DC power of 30 V, 0 V, 30 V, 0 V, 30 V, and 0 V which are inverted may be repeatedly applied to the second electrode to generate variable power having the predetermined amplitude and period.

The power may be a voltage (amplitude) of about 0.1 V to about 1,000 V and a frequency of about 10 Hz to about 100 GHz. The self-aligned nano-scale LED devices may be contained in a solvent and then injected to the electrode line. The solvent may drop onto the electrode and simultaneously be evaporated. Also, since charges are asymmetrically induced to the nano-scale LED devices due to induction of electric fields generated by a potential difference between the two electrodes, both ends of the nano-scale LED device may be self-aligned between the facing two electrodes different from each other. The nano-scale LED device may be connected to the two electrodes different from each other by applying power for about 5 seconds to about 120 seconds.

In the step (2), the number N of nano-scale LED devices connected to both of the first and second electrodes may depend on several variables that are adjustable in the step (2). The variable may include a voltage V of the power, a frequency F (Hz) of the power, a concentration C (wt % of the nano-scale LED) of the solution containing the nano-scale LED devices, a distance Z between the two electrodes, and an aspect ratio AR of the nano-scale LED (where AR=H/D, and D is a diameter of the nano-scale LED). Here, the number N of nano-scale LED devices connected to both of the first and second electrodes may be in proportion to the voltage V, the frequency F (Hz), the concentration C of the solution containing the nano-scale LED devices, and an aspect ratio AR of the nano-scale LED and be in inverse proportion to the distance Z between the two electrodes.

Thus, the nano-scale LED devices may be self-aligned between the two electrodes different from each other by the induction of the electric fields generated by the potential difference between the two electrodes. Here, the more the intensity of the electric fields increases, the more the number of nano-scale LED devices may increase. Also, the intensity of the electric fields may be in proportion to a potential difference V between the two electrodes and be in inverse proportion to the distance Z between the two electrodes.

The more the concentration C (the wt % of the nano-scale LED devices) of the solution containing the nano-scale LED devices increases, the more the number of LED devices connected to the electrodes may increase.

In case of the frequency H (Hz), since a difference in charge generated in the nano-scale LED device may vary according to the frequency, if the frequency increases, the number of nano-scale LED device may increase. However, if the frequency is greater than a predetermined value, the number of nano-scale LED devices connected to the electrodes may decrease.

If the aspect ratio of the nano-scale LED device increases, the induced charge of the electric fields increases. Thus, more number of nano-scale LED devices may be aligned. Also, when considering the electrode line having a limited region in spatial aspect of the alignment of the nano-scale LED devices, in a state where the nano-scale LED device has a fixed length, the nano-scale LED device may decrease in diameter. Thus, if the aspect ratio increases, the number of nano-scale LED devices connected to the electrode line having the limited region may increase.

The above-described factors may adjust the number of LED devices connected to the electrodes according to their purposes.

Also, even though the power is applied to the electrode line according to the aspect ratio of the nano-scale LED device in the step (2) according to the present invention, it may be difficult to self-align the nano-scale LED devices. Thus, according to an embodiment of the present invention, the aspect ratio of the nano-scale LED device according to the present invention may be about 1.2 to about 100, preferably, about 1.2 to about 50, more preferably, about 1.5 to about 2.0, and further preferably, about 1.5 to about 10. If the aspect ratio of the nano-scale LED device is about 1.2 or less, even though the power is applied to the electrode line, the nano-scale LED devices may not be self-aligned. If the aspect ratio of the nano-scale LED device exceeds about 100, a voltage of the power for self-aligning the nano-scale LED devices may be reduced. However, when the nano-scale LED device is manufactured by using the dry etching, it may be difficult to manufacture the device having the aspect ratio that exceeds about 100.

In the step (2), the number of nano-scale LED devices per an area (about 100 μm×100 μm) of the electrode line on which the nano-scale LED devices are substantially mounted may be about 2 to about 100,000, preferably, about 10 to about 10,000. Since the plurality of nano-scale LED devices are provided in each of the nano-scale LED electrode assemblies, the nano-scale LED electrode assembly may be minimized in function degradation or loss due to the malfunction of portions of the plurality of nano-scale LED devices. Also, if the number of nano-scale LED devices exceeds about 100,000, manufacturing costs may increase, and also, it may be difficult to align the nano-scale LED devices.

The method for manufacturing the nano-scale LED electrode assembly according to an embodiment of the present invention may be a step (3) after the step (3) and include a process of forming a metal ohmic layer at a connection portion between each of the first and second electrodes and the nano-scale LED device.

A reason in which the metal ohmic layer is formed on the connection portion is because the nano-scale LED devices emit light when the power is applied to the two electrodes different from each other, to which the plurality of nano-scale LED devices are connected. Here, large resistance may occur between the electrodes and the nano-scale LED devices. Thus, to reduce the resistance, the process of forming the metal ohmic layer may be performed.

Particularly, although the metal ohmic layer is formed through the following process, the present invention is not limited thereto. That is, a general method for forming the metal ohmic layer may be used.

First, a photo resist is applied to a thickness of about 2 μm to about 3 μm on an upper portion of the nano-scale LED electrode assembly in which the step (2) is performed. The coating may be performed through one of spin coating, spray coating, and screen printing, but is not limited thereto.

Thereafter, UV ray may be irradiated from a lower side of the base substrate of the nano-scale LED electrode assembly toward the coating photo resist to cure the rest photo resist layer except for the photo resist layer disposed on an upper portion of the electrode, and then, the photo resist layer disposed on the upper portion of the electrode that is not cured may be removed by using a general photo resist solvent.

Gold or silver may be deposited on the upper portion of the electrode, from which the photo resist is removed, through vacuum deposition or electrochemical deposition, or gold nano crystal or silver nano crystal may be electrically sprayed and applied to the upper portion of the electrode. However, the present invention is not limited to the deposited material and method. For example, the coating metal layer may have a thickness of about 5 nm to about 100 mm, but is not limited thereto.

Thereafter, the metal layer that does not correspond to the electrode may be removed together with the photo resist by using one photo resist stripper of 1-methyl-2-pyrrolidone (NMP) and dimethyl sulfoxide (DMSO), and then, thermal treating at a temperature of about 500° C. to about 600° C. may performed to form the metal ohmic layer between both ends that are not coated with the insulation film of the nano-scale LED device and the electrode.

A second embodiment of the present invention provides a method for manufacturing a nano-scale LED assembly, the method including: (1) injecting a plurality of nano-scale LED devices to an electrode line including a base substrate, a first electrode formed on the base substrate, and a second electrode spaced apart form the first electrode on the same plane as the first electrode; and (2) injecting a solvent to the electrode line to connect the plurality of nano-scale LED devices to both of the first and second electrodes, thereby applying power to the electrode line to self-align the plurality of nano-scale LED devices, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film covering the whole outer surface of a portion of at least the active layer to prevent an electrical short-circuit occurring due to contact between the active layer of the nano-scale LED device and the electrode line from occurring, and a width X of the first electrode, a width Y of the second electrode, a distance Z between the first electrode and the second electrode adjacent to the first electrode, and a length H of the nano-scale LED device satisfy following relation expression 1.

$0.5Z \leq H \leq X+Y+2Z$, where 100 nm $\langle X \leq 10$ μm, 100 nm $\langle Y \leq 10$ μm, and 100 nm $\langle Z \leq 10$ μm. [Relation Expression 1]

Different points between a second embodiment of the present invention and the first embodiment of the present invention will be described.

The second embodiment of the present invention is different from the first embodiment of the present invention in that a nano-scale LED device, but the solution containing the nano-scale LED device may be injected.

In case of the nano-scale LED electrode assembly manufactured according to the first embodiment, since the nano-scale LED device is injected in a solution state, nano-scale LED devices may be aggregated on an electrode line region and then disposed at a specific portion or be floated in the solution and thus spread to an edge of the electrode line so that the nano-scale LED devices are concentratedly mounted on the edge of the electrode line.

The second embodiment of the present invention may provide solve the above-described limitation. That is, the nano-scale LED devices may be concentrated and mounted on a desired region of the electrode line and also be uniformly dispersed and mounted on the desired region to minimize the aggregation of the nano-scale LED devices.

For this, according to the second embodiment of the present invention, the nano-scale LED devices may not be injected to the electrode line in the solution state. That is, the nano-scale LED devices may be injected, and then a solvent for moving the nano-scale LED devices may be injected. Then, power is applied to allow the nano-scale LED devices to be concentratedly mounted on the desired electrode region.

Figure 11:
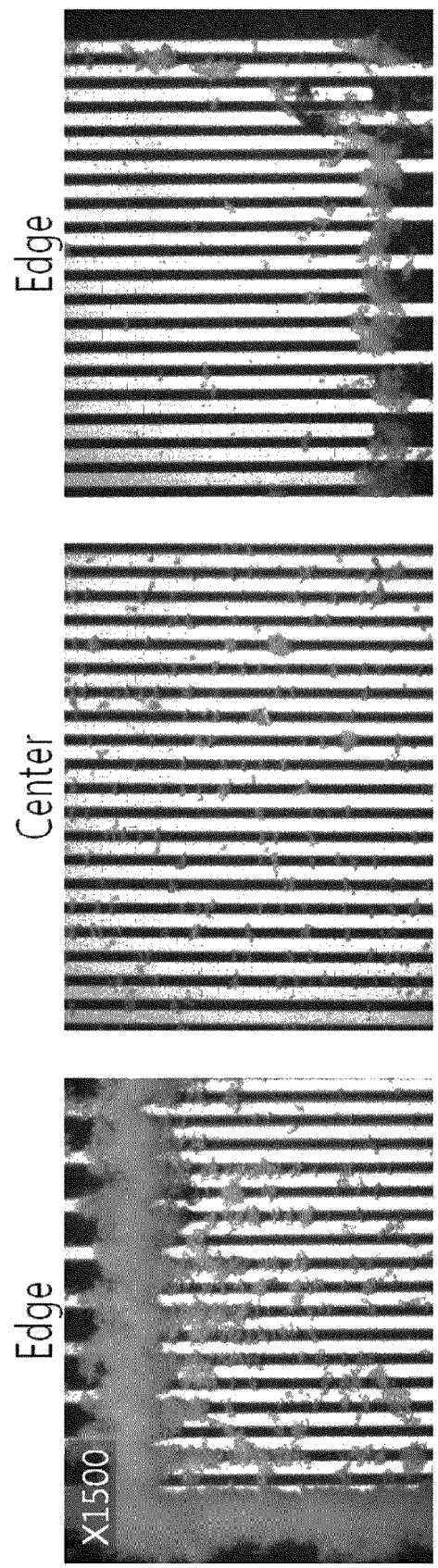
FIG. 11 is an optical microscope photograph obtained by the nano-scale LED electrode assembly manufactured according to the first embodiment of the present invention by 1,500 times.
Figure 12:
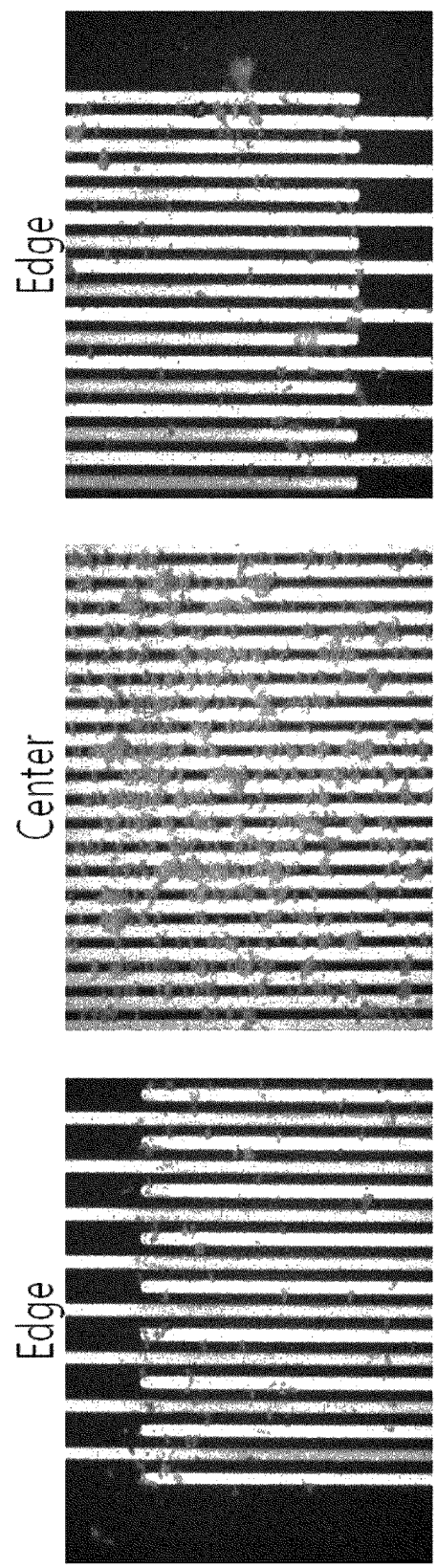
FIG. 12 is an optical microscope photograph obtained by a nano-scale LED electrode assembly manufactured according to a second embodiment of the present invention by 1,500 times.

FIG. 11 is an optical microscope photograph obtained by the nano-scale LED electrode assembly manufactured according to the first embodiment of the present invention by 1,500 times, and FIG. 12 is an optical microscope photograph obtained by a nano-scale LED electrode assembly manufactured according to a second embodiment of the present invention by 1,500 times. In FIG. 11, it is seen that the nano-scale LED devices are concentratedly mounted at the edge than a center of the electrode line. Furthermore, it is seen that the nano-scale LED devices are aggregated at the edge and then mounted. On the other hand, in FIG. 12, it is seen that the nano-scale LED devices are not concentrated at the edge of the electrode line, but uniformly dispersed at the center to minimize the aggregation of the nano-scale LED devices.

Figure 13:
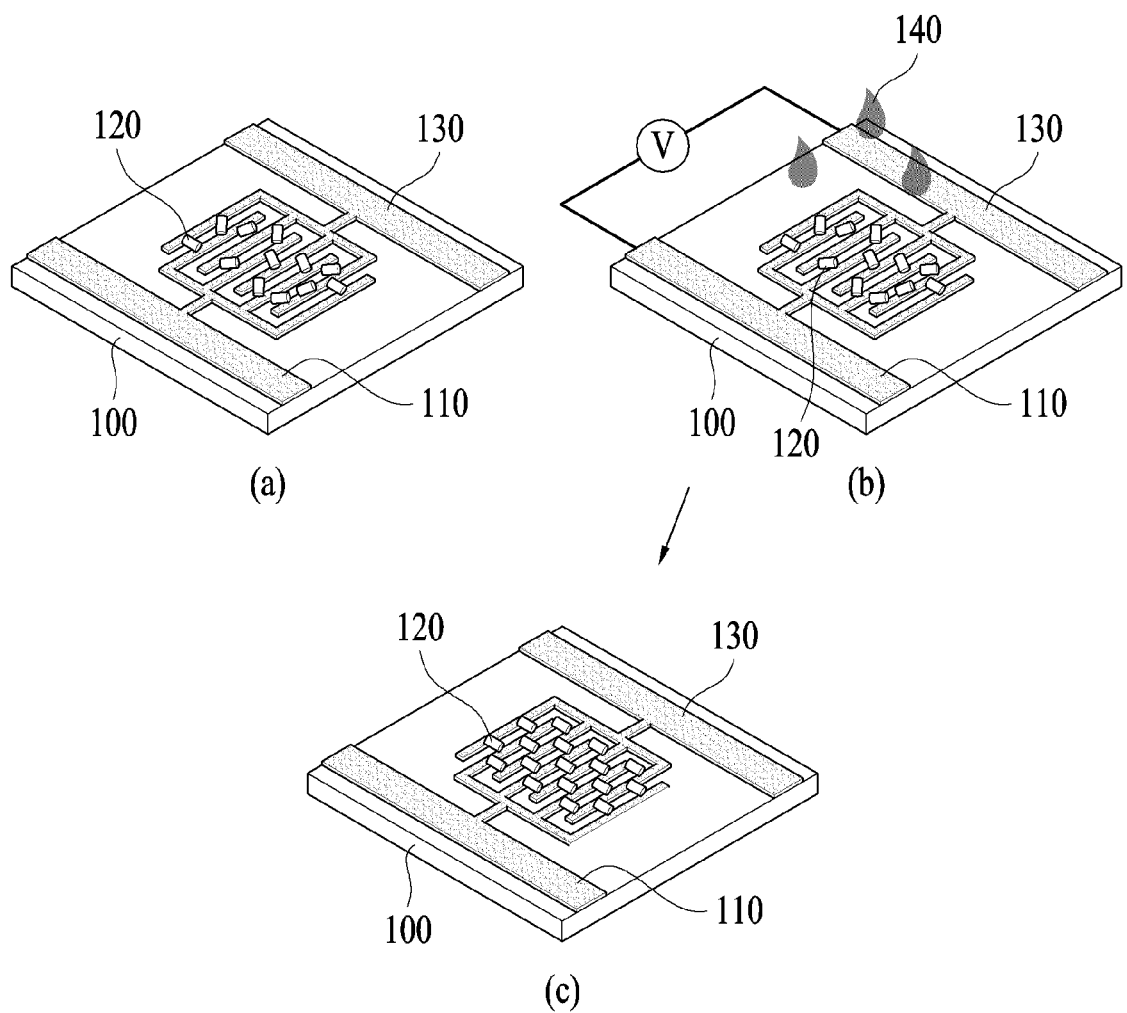
FIG. 13 is a perspective view illustrating a process of manufacturing the nano-scale LED electrode assembly according to the second embodiment of the present invention.

FIG. 13 is a perspective view illustrating a process of manufacturing the nano-scale LED electrode assembly according to the second embodiment of the present invention. FIG. 13A illustrates a first electrode 110 formed on a base substrate 100, a second electrode 130 spaced apart from the first electrode 110 on the same plane as the first electrode, and a nano-scale LED device 120 injected to the electrode line including the first and second electrode 110 and 130.

Since detailed description of the electrode line and the nano-scale LED device in a step (1) according to the second embodiment of the present invention are the same as those according to the first embodiment of the present invention, their detailed descriptions will be omitted.

In the step (1) according to the second embodiment of the present invention, the method for injecting the nano-scale LED devices to the electrode line is not specifically limited. For example, the nano-scale LED device may be manufactured into a particle having a core shell structure including a core and a polymer shell surrounding the core or a core-sheath complex fiber and then be injected to the electrode line. Here, a specific kind of polymer component for forming the shell (or core-sheath) is not limited if the polymer component does not have an influence on the nano-scale LED device that is immersed into the core (or core-sheath). However, a polymer that is soluble by a solvent to be injected in a step (2) that will be described below may be used. Also, the particle or complex fiber may be changed in diameter and shape according to its purpose, but is not specifically limited.

Also, in the step (1) according to the second embodiment of the present invention, the nano-scale LED device may be injected to the electrode line region surrounded by an insulation barrier. When the solvent is injected in the step (2), escape of the nano-scale LED device to the outside of the electrode line may be minimized by the insulation barrier. Since description of the insulation barrier is equal to that of the insulation barrier according to the first embodiment of the present invention, its detailed description will be omitted.

Next, according to the second embodiment of the present invention, the step (2) may include a process of injecting the solvent to the electrode line to connect a plurality of nano-scale LED devices to the first and second electrodes and applying power to the electrode line to self-align the plurality of nano-scale LED devices.

When the solvent 140 is injected to the electrode lines 110 and 130, and the power is applied to the electrode lines 110 and 130 to self-align the nano-scale LED devices as illustrated in FIG. 13B, the nano-scale LED devices may be connected to the first and second electrodes 110 and 130 of the electrode line as illustrated in FIG. 13C. Since a specific kind of solvent 140 to be injected in the step (2) and intensity of the power are the same as those according to the first embodiment of the present invention, their detailed descriptions will be omitted.

An amount of solvent to be injected in the step (2) may have about 100 weight parts to about 12,000 weight parts with respect to 100 weight parts of the nano-scale LED device to be injected. If the amount of solvent exceeds about 12,000 weight part, since the amount of solvent is too much, the nano-scale LED devices may be spread to a region except for the desired electrode line region by the solvent, and thus, the number of nano-scale LED devices to be mounted on a desired mounting region may be very small. If the amount of solvent has about 100 weight parts or less, movement or alignment of the nano-scale LED devices may be interrupted.

In the step (2), the injection of the solvent and the applying of the power may be simultaneously or successively performed.

A nano-scale LED electrode assembly includes: a base substrate; an electrode line including a first electrode formed on the base substrate and a second electrode spaced apart from the first electrode on the same plane as the first electrode; and a plurality of nano-scale LED devices connected to both of the first and second electrodes, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers the whole outer surface of a portion of at least the active layer to prevent an electrical short-circuit occurring due to contact between the active layer of the nano-scale LED device and the electrode line from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$0.5Z \leq H < X+Y+2Z$, where 100 nm $\langle X \leq 10$ μm, 100 nm $\langle Y \leq 10$ μm, and 100 nm $\langle Z \leq 10$ μm.[Relation Expression 1]

Since detailed descriptions of the base substrate, the electrode line including the first and second electrodes, the nano-scale LED device, and the relation expression 1 are the same as those according to the first embodiment of the present invention, their detailed descriptions will be omitted. Portions that are not explained in the manufacturing method will be mainly described.

Figure 14:
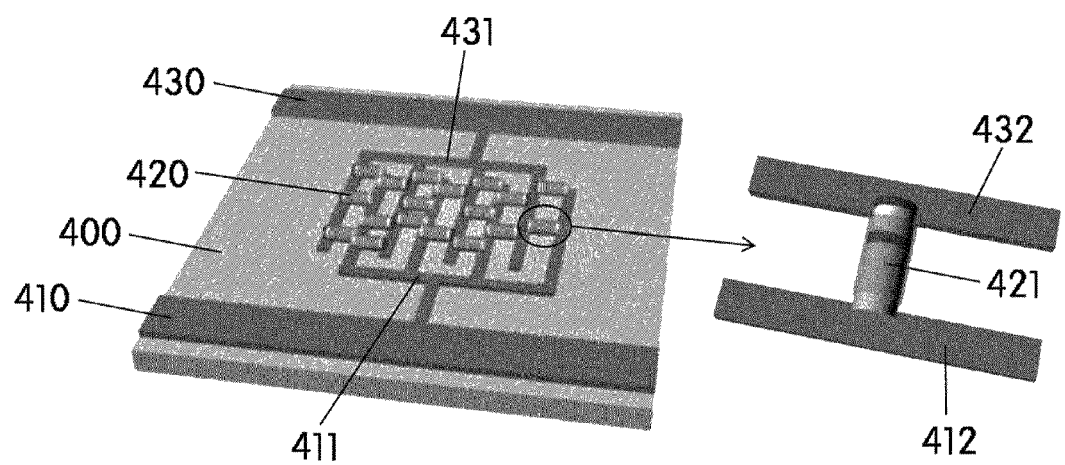
FIG. 14 is a perspective and partial enlarged view of the nano-scale LED electrode assembly according to an embodiment of the present invention.

FIG. 14 is a perspective and partial enlarged view of the nano-scale LED electrode assembly according to an embodiment of the present invention. FIG. 14 illustrates first electrodes 410 and 411 disposed on a base substrate 400, second electrodes 430 and 431 spaced apart from the first electrodes 410 and 411 on the same plane as the first electrodes, and a plurality of nano-scale LED devices 420 connected to both of the first and second electrodes.

Since the first and second electrodes 411 and 431 are disposed on the same plane, the nano-scale LED devices may be connected in a laid state. Thus, since it is difficult to allow the nano-scale LED device having a nano unit to three-dimensionally stand up to be connected, it may be unnecessary to allow the nano-scale LED device to stand up to be connected to the electrode.

Also, since the electrodes are spaced apart from each other on the same plane, the nano-scale LED device may be connected to the base substrate in the laid state. Thus, extraction efficiency of the nano-scale LED device may be significantly improved. In detail, the nano-scale LED devices may be laid parallel to the base substrate.

Particularly, in FIG. 14, it is seen that the nano-scale LED device 421 is connected both of the first and second electrode 412 and 432 and laid parallel to the base substrate.

Figure 15:
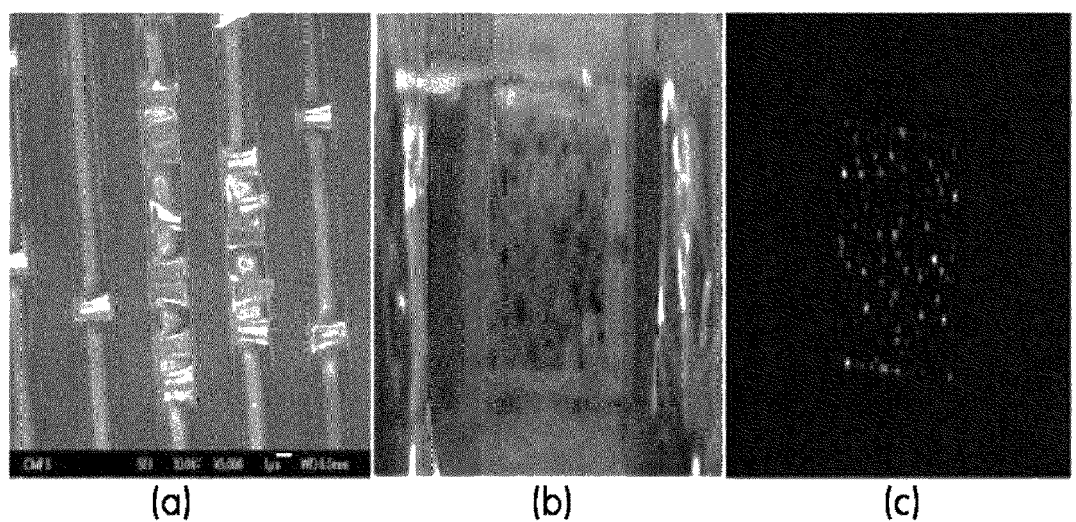
FIG. 15 is a SEM photograph of the nano-scale electrode assembly and a blue electroluminescent photograph of the nano-scale LED electrode assembly according to an embodiment of the present invention.

FIG. 15 is a SEM photograph of the nano-scale electrode assembly and a blue electroluminescent photograph of the nano-scale LED electrode assembly according to an embodiment of the present invention. In the SEM photograph according to an embodiment of the present invention, the first electrode may have a width of about 3 μm, the second electrode may have a width of about 3 μm, a distance between the electrodes may be about 2 μm, and each of the electrodes may have a thickness of about 2 μm. Also, the nano-scale LED device connected to the electrode may have a length of about μm and a radius of about 500 nm, and a paste concentration injected to be connected to the electrode may have about 1.0 weight part of nano-scale LED device with respect to 100 weight parts of acetone. Furthermore, to self-align the nano-scale LED device to the electrode, AC power having a voltage of about VAC=30 V and a frequency of about 500 kHz may be applied for one minute.

As seen in the SEM photograph, the nano-scale LED device is disposed over the first and second electrodes or inserted between the two electrodes. Also, it is seen that the nano-scale LED device is laid when connected.

Also, FIGS. 15B and 15C are a blue electroluminescent photograph of the nano-scale LED electrode assembly according to an embodiment of the present invention. Here, FIG. 15B is a photograph that is photographed in a dark room, and FIG. 15C is a photograph that is photographed in a bright room. According to an embodiment of the present invention, a subject of the photography may be a unit electrode including a plurality of nano-scale LED electrode assembly that is formed on an area of 0.6 cm×0.7 cm. Here, it is seen that the nano-scale LED device provided in the nano-scale electrode assembly has point emission, and also, and then the nano-scale LED devices having the point emission are coupled to realize surface emission.

It is seen in literature that the plurality of nano-scale LED devices are easily assembled on the electrode having a wide area by using the nano-scale LED devices. Also, the electrode may be adjusted in size to realize various point light sources, line light sources, and surface light sources. Also, when the point light source is reduced to a size of a color cell and then integrated, the point light source may be applicable of displays. In addition, when a transparent base substrate is used as the substrate, the point light source may be applicable of transparent light sources and displays. Furthermore, when a flexible base substrate is used, the point light source may be applicable of flexible light sources and flexible displays.

Thus, the nano-scale LED device assembled parallel to the base substrate to lie on the electrodes that are interdigitally disposed may be a high efficiency LED device having high light extraction efficiency. Thus, it is seen in literature that various light sources such as the point light source, the surface light source, the line light source, and the color cell, which contain the nano-scale LED device are realized.

Also, FIGS. 15B and 15C illustrate a state in which the metal ohmic layer is not provided between the nano-scale LED device and the electrode according to an embodiment of the present invention. Thus, if the metal ohmic layer may be further provided to reduce resistance between the nano-scale LED device and the electrode, the light emitting efficiency may be further improved.

Figure 16:
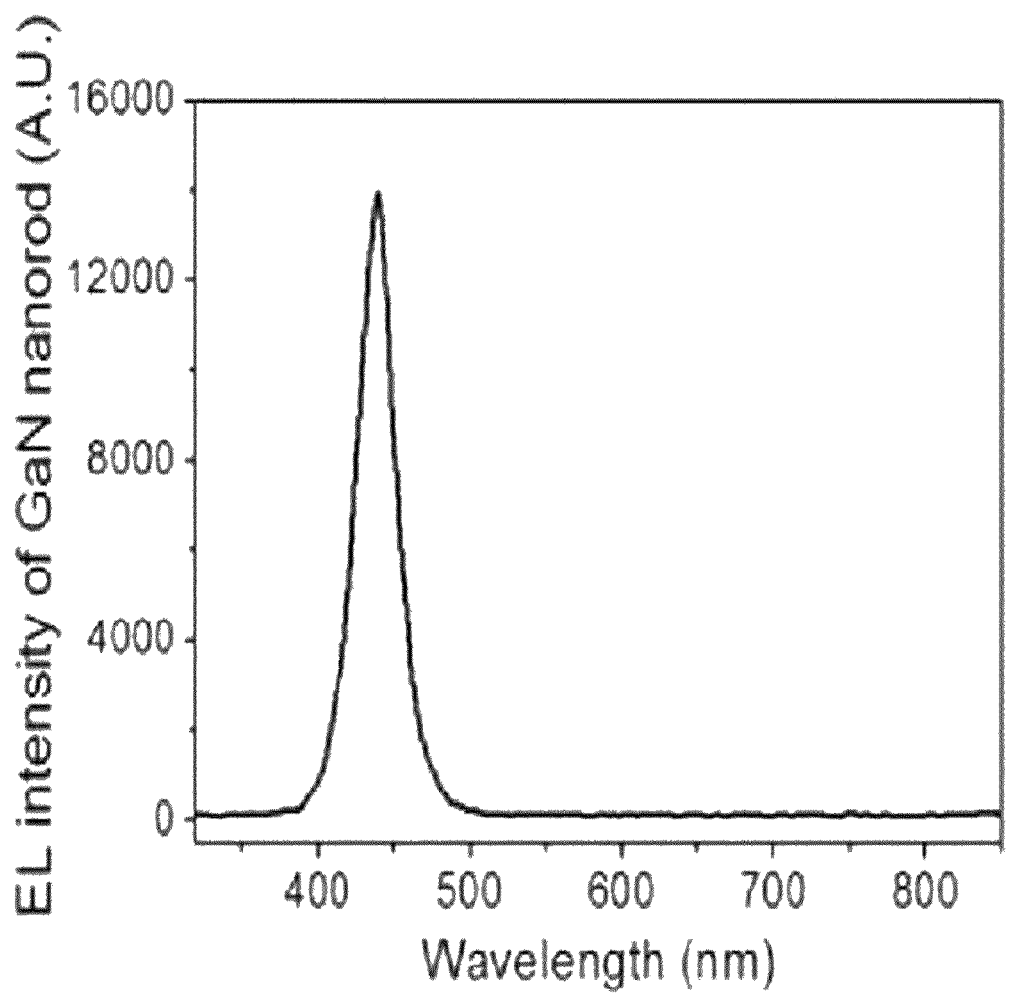
FIG. 16 is a blue electroluminescent spectrum of the nano-scale LED electrode assembly according to an embodiment of the present invention.

Furthermore, FIG. 16 is a blue electroluminescent spectrum of the nano-scale LED electrode assembly according to an embodiment of the present invention. That is, FIG. 16 illustrates results obtained by measuring electroluminescence by using spectrometer according to an embodiment of the present invention. The electroluminescent blue nano-scale LED device may be a nano-scale LED device that is manufactured by using a wafer substrate. Here, it is seen that the original blue emission such as the emission spectrum of FIG. 16 is well maintained after the nano-scale LED devices on which various drying etching processes and laser lift-off processes are performed to manufacture the nano-scale LED device are self-aligned between the electrodes different from each other.

It is indirectly seen that defects occurring during the process of manufacturing the nano-scale LED device in which the first electrode layer, the first conductive type semiconductor layer, the active layer, the second conductive type semiconductor layer, and the second electrode layer are successively arranged are minimized. That is, in the process of manufacturing the nano-scale LED device by using a blue wafer, stress and defects existing in the wafer substrate may be reduced by the process of reducing the LED device to a nano-size and the etching process to manufacture the nano-scale LED device having superior crystalline. Here, it is seen that the nano-scale LED devices having the superior crystalline excellently emit light in the state where the nano-scale LED devices are self-aligned on the electrodes different from each other.

The nano-scale LED device may be connected to the electrode in the "parallely laid" state on the base substrate. Thus, the nano-scale LED electrode assembly may have very superior light extraction efficiency. In general, performance of the LED device may be evaluated through external quantum efficiency.

The external quantum efficiency denotes a ratio of the number of photons leaking to the outside of the LED, i.e., air for a unit time to the number of carriers injected into the LED device for the unit time. The external quantum efficiency may be expressed as following relation expression between internal quantum efficiency and light extraction efficiency.

External quantum efficiency=internal quantum efficiency×light extraction efficiency [Relation Expression]

The internal quantum efficiency denotes a ratio of the number of photons emitted form the active layer for the unit time to the number of carrier injected into the LED device for the unit time, and the light extraction efficiency denotes a ratio of the number of photons leaking to the air for the unit time to the number of photons emitted from the active layer for the unit time. As a result, to improve the performance of the LED device, the improvement of the efficiency is impossible.

However, in aspect of the light extraction efficiency, light emitted to the air through the upper and lower electrodes or the n-type conductive semiconductor layer and p-type conductive semiconductor layer of the nano-scale LED device having a thin film shape may have very low extraction efficiency. This is done for a reason in which, since the most light emitted from the LED device is totally reflected by a difference in refractive index on an interface between a high-refractive semiconductor layer and a high-refractive air layer, the light is captured in the semiconductor layer, and thus, a large amount of light emitted from the active layer is not escaped in the light extraction direction, but is reabsorbed or dissipated as heat. This may be caused due to the LED device having the existing thin film structure.

To solve this limitation, the nano-scale LED device may be connected to the electrode in the laid state to remove the flat interface between the high-refractive semiconductor layer and the air layer. Thus, the possibility of an occurrence of the total reflection may be minimized to minimize the light emitted form the nano-scale LED device, which is not extracted to the outside, but is captured in the semiconductor layer, thereby emitting the most light to the outside. Thus, the nano-scale LED electrode assembly in which the conventional light extraction reduction limitation is solved may be provided.

Figure 17:
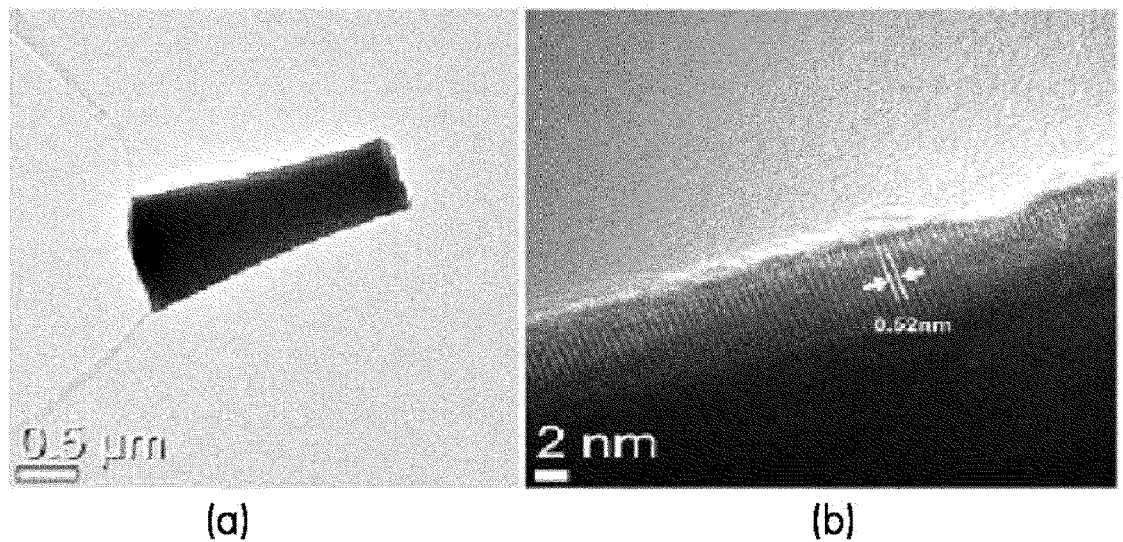
FIG. 17 is a TEM photograph of the nano-scale LED device according to an embodiment of the present invention.

FIG. 17 is a TEM photograph of the nano-scale LED device according to an embodiment of the present invention. FIG. 17A is a TEM photograph illustrating the whole nano-scale LED device having a cylindrical shape, and FIG. 17B is a high resolution TEM photograph illustrating a surface of the nano-scale LED device. As seen in FIG. 17B, it is seen that, even though the dry etching process and the laser lift-off process are performed to manufacture the nano-scale LED device, atoms of an InGaN crystal around the surface of the nano-scale LED device are regularly and well arranged. Thus, it is seen that the crystalline of the nano-scale LED device which is obtained through the various manufacturing processes is very important. Also, it is seen that the high-efficient nano-scale LED device is capable of being manufactured. That is, since the crystalline of the manufactured nano-scale LED device is very important, the internal quantum efficiency may be superior. Also, since the nano-scale LED devices are horizontally aligned between the two electrodes different from each other, the light extraction efficiency may be superior. Thus, it is directly seen that the nano-scale LED electrode assembly containing the high-efficient LED device having the superior internal and external quantum efficiency is realizable.

The nano-scale LED electrode assembly may include a single or plurality of arrangement regions on which the unit electrodes, i.e., the two electrodes for independently operating the nano-scale LED devices that are arranged once. The unit electrode may have an area of about 1 μm$^2$ to about 100 cm$^2$, preferably, about 10 μm$^2$ to about 100 mm$^2$, but is not limited thereto.

If the unit electrode included in the nano-scale LED electrode assembly has an area of about 1 μm$^2$ or less, it may be difficult to manufacture the unit electrode. Thus, since the nano-scale LED device has to be reduced in length, this may has an influence on the manufacture of the nano-scale LED device. If the area of the unit electrode exceeds about 100 cm$^2$, the number of nano-scale LED devices may increase to increase the manufacturing costs, and also, non-uniformity in distribution of the nano-scale LED devices may occur.

Preferably, the number of nano-scale LED devices per an area (about 100×100 μm$^2$) of the nano-scale electrode assembly may be about 2 to about 100,000, preferably, about 10 to about 10,000. Since the plurality of nano-scale LED devices are provided in each of the nano-scale LED electrode assemblies, the nano-scale LED electrode assembly may be minimized in function degradation or loss due to the malfunction of portions of the plurality of nano-scale LED devices. Also, if the number of nano-scale LED devices exceeds about 100,000, the manufacturing costs may increase, and also, it may be difficult to align the nano-scale LED devices.

The term "the area of the nano-scale LED electrode assembly" may denote an area of the electrode region, on which the nano-scale LED is substantially mounted.

Although the present invention is specifically described through following Examples, the present invention is not limited to the following Examples, and also Examples are described to provide more general understandings of the present invention.

EXAMPLE 1

An electrode line as illustrated in FIG. 3 was manufactured on a base substrate formed of quartz and having a thickness of about 800 μm. Here, in the electrode line, a first electrode has a width of about 3 μm, a second electrode has a width of about 3 μm, a distance between the first electrode and the second electrode is about 2 μm, and each of the electrodes has a thickness of about 0.2 μm. Also, each of the first and second electrodes is formed of a titanium/gold material, and an electrode line region on which the nano-scale LED device has an area of about 4.2×10$^7$ μm$^2$. Thereafter, an insulation barrier as illustrated in FIG. 9 was formed on the base substrate. The insulation barrier was formed of silicon dioxide, and a height from the base substrate to an end of the insulation barrier is about 0.1 μm. Here, the insulation barrier was formed on the base substrate except for the region (area of 4.2×10$^7$ μm$^2$) in which the nano-scale LED device is mounted on the electrode line.

Then, the nano-scale LED device having a specification of following Table 1 and the structure of FIG. 6 and coated to a thickness of about 0.02 μm with an insulation film on an outer surface of the active layer of the nano-scale LED device was mixed by about 1.0 weight part with respect to 100 weight parts of acetone to manufacture a solution containing the nano-scale LED devices.

The manufactured solution dropped to the electrode line region surrounded by the insulation barrier on the base substrate to apply AC power having a voltage of VAC=30 V and a frequency of about 950 kHz to the electrode line for one minute, thereby manufacturing the nano-scale LED electrode assembly.

TABLE 1

| | Material | Length (μm) | Diameter (μm) |
|---|---|---|---|
| First electrode layer | Chrome | 0.03 | 0.6 |
| First conductive type semiconductor layer | n-GaN | 1.64 | 0.6 |
| Active layer | InGaN | 0.1 | 0.6 |
| Second conductive type semiconductor layer | p-GaN | 0.2 | 0.6 |
| Second electrode layer | Chrome | 0.03 | 0.6 |
| Insulation film | Aluminum oxide | | 0.02 (Thickness) |
| Nano-scale LED device | | 2 | 0.62 |

EXAMPLE 2

Although the same process as Example 1 is performed, the insulation barrier was not formed, and nano-scale LED devices dropped onto an electrode line formed on a base substrate which does not include the insulation barrier to manufacture a nano-scale LED electrode assembly.

EXAMPLE 3

Although the same process as Example 1 is performed, nano-scale LED devices were injected to an electrode line region, instead that the solution containing the nano-scale LED devices drops to the electrode line region surrounded by the insulation barrier on the base substrate. Then, acetone was injected to the region on which the nano-scale LED devices are injected. Here, the injected acetone has about 10,000 weight parts with respect to 100 weight parts of the nano-scale LED devices. While the solvent is injected, AC power having a voltage of VAC=30 V and a frequency of about 950 kHz was applied to the electrode line for one minute to manufacture the nano-scale LED electrode assembly.

COMPARATIVE EXAMPLE

Although the same process as Example 1 is performed, the nano-scale LED electrode assembly was manufactured by using nano-scale LED devices in which the insulation barrier is not provided on an outer surface of the active layer of the nano-scale LED device.

EXERIMENTAL EXAMPLE 1

In the nano-scale LED electrode assembly manufactured in Examples 1 and 2 and Comparative Example, AC power having a voltage of about VAC=30 V and a frequency of about 950 kHz is applied to the electrode line for one minute to observe the number of nano-scale LED devices that emits blue light through an optical microscope. Then, the number is counted, and thus the result is in following Table 2.

TABLE 2

| | Number of nano-scale LED device emitting blue light |
|---|---|
| Example 1 | 8604 |
| Example 2 | 4508 |
| Example 3 | 8945 |
| Comparative Example | 2792 |

As seen in Table 2, in case of Comparative Example in which the electrode assembly the nano-scale LED device that does not include the insulation film on the active layer of the nano-scale LED device is provided, the number of nano-scale LED devices that emits blue light is significantly less than those in Example 1 to 3. Thus, it is sent that the active layer of the nano-scale LED device contacts the electrode to frequently cause electrical short-circuit.

Also, in case of Example 2 in which the solution containing the nano-scale LED devices is injected to the electrode line in which the insulation barrier is not provided, the number of nano-scale LED devices that emit blue light is less than that in Example 1. Thus, it is seen that the number of nano-scale LED devices electrically connected to the electrode line because, when the solution containing the nano-scale LED devices is injected to the electrode line in which the insulation barrier is not provided, the nano-scale LED devices are spread to the outside of the electrode line, on which the nano-scale LED devices are not mounted.

Also, when compared to Example 1 in which the nano-scale LED devices having the solution state is injected, it is seen that the number of nano-scale LED devices that emits the blue light significantly increases in Example 3 in which the nano-scale LED devices are injected, and then the solution is injected while the power is applied. Thus, when the nano-scale LED devices having the solution state are injected, it is seen that the spread of the nano-scale LED devices into the region on which the devices are not mounted increases, and the LED devices that are not mounted exit.

EXPERIMENTAL EXAMPLE 2

A voltage required for self-aligning the nano-scale LED devices according to the aspect ratio of the nano-scale LED devices is measured. Here, the aspect ratio of the nano-scale LED devices is measured by using the nano-scale LED devices manufactured by changing as shown in Table 3. Also, a minimum voltage for stating the self-alignment of the nano-scale LED devices is measured as shown in Table 3.

TABLE 3

| | Length (H, μm) | Diameter (D, μm) | Aspect ratio (AR = H/D) | Applied voltage (V) |
| --- | --- | --- | --- | --- |
| Example 4 | 2 | 2 | 1 | — |
| Example 5 | 2 | 1.7 | 1.2 | 262 |
| Example 6 | 2 | 1.5 | 1.3 | 136 |
| Example 7 | 2 | 1.2 | 1.7 | 73 |
| Example 8 | 2 | 1 | 2 | 53 |
| Example 9 | 2 | 0.8 | 2.5 | 40 |
| Example 10 | 2 | 0.4 | 5 | 23 |
| Example 11 | 2 | 0.2 | 10 | 15 |

As seen in Table 3, it is seen that the required voltage significantly increases to self-align the nano-scale LED devices when the aspect ratio of the nano-scale LED devices decreases. In case of Example 4 in which the aspect ratio of nano-scale LED devices is less than about 1.2, in spite that the voltage of the power increases, the self-alignment of the nano-scale LED devices to the electrode is impossible. Also, in case of Examples 5 and 6 in which the aspect ratios of the nano-scale LED devices are about 1.2 and about 1.3, respectively, it is seen that the voltage required for self-aligning the nano-scale LED devices significantly increases when compared to that in Example 7.

EXPERIMENTAL EXAMPLE 3

The nano-scale electrode assemblies manufactured in Examples 1 and 3 are magnified to 1,500 times to photograph the magnified nano-scale assemblies by using the optical microscope. The results are illustrated in FIG. 11 in Example 1 and illustrated in FIG. 12 in Example 3, respectively.

As illustrated in FIG. 12, in case of Example 3, it is sent that the nano-scale LED devices are concentratedly self-aligned to the desired portion of the electrode without being concentrated to the outside, whereas, in case of Example 1 of FIG. 11, it is seen that the nano-scale LED devices are self-aligned to be spread outward from the desired center of the electrode region, and the aggregation of the nano-scale LED devices significantly occurs.

In the nano-scale LED electrode assembly and the method for manufacturing the same according to the present invention, first, the independently manufactured nano-scale LED device having the nano unit may be connected to the two electrodes different from each other to solve the limitations in the related art, i.e., when the nano-scale LED device is three-dimensionally coupled to the electrode in the stand-up state, it is difficult to allow the nano-scale LED device to stand up, and also, it is difficult to couple the nano-scale LED device to one-to-one correspond to the nano-scale electrodes different from each other.

Also, due to the structure of the nano-scale LED device connected to the electrode and the relative position of the substrate, i.e., due to the arrangement of the nano-scale LED device horizontally disposed on the substrate in the longitudinal direction of the nano-scale LED device, an amount of photons emitted to the air among the photons generated in the active layer may increase to significantly improve the light extraction efficiency of the nano-scale LED electrode assembly. Furthermore, the number of nano-scale LED devices connected to the electrodes different from each other may be adjusted.

Second, since the nano-scale LED device is not three-dimensionally coupled to the upper and lower electrodes in the stand-up state, the nano-scale LED may be easily self-assembled between the two electrodes different from each other. Thus, the large area producing process in which the nano-scale LEDs are operably arranged on a large-scale plane may be enabled.

Also, to prevent the defects such as the electrical short-circuit from occurring, it may be unnecessary to allow the nano-scale LED device to be formed in the specific structural shape. That is, the nano-scale LED device having the general shape may be used to prevent the electrical short-circuit between the nano-scale LED device and the electrode from occurring, thereby minimizing the defect rate of the nano-scale LED electrode assembly. Also, in preparation for the occurrence of the very rare defects of the LED device, the plurality of LED devices may be connected to the electrode to maintain the original function of the nano-scale LED electrode assembly.

Furthermore, the nano-scale LED devices may be concentratedly disposed and connected to the desired mounting region of the electrode line.

Although embodiments have been described with reference to a number of illustrative embodiments thereof, it should be understood that numerous other modifications and embodiments can be devised by those skilled in the art that will fall within the spirit and scope of the principles of this invention. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A nano-scale LED electrode assembly comprising:
a base substrate;
    an electrode line comprising a first electrode formed on the base substrate and a second electrode spaced apart from the first electrode on the same plane as the first electrode; and
    a plurality of nano-scale LED devices connected to both of the first and second electrodes,
    wherein each of the nano-scale LED devices comprises: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer,
    the nano-scale LED device further comprises an insulation film, which covers the whole outer surface of a portion of at least the active layer to prevent an electrical short-circuit occurring due to contact between the active layer of the nano-scale LED device and the electrode line from occurring, on an outer surface thereof,
    the nano-scale LED device having a length of about 100 nm to about 10 μm and an aspect ratio of about 1.2 to about 100, and
    a width X of the first electrode, a width Y of the second electrode, a distance Z between the first electrode and the second electrode adjacent to the first electrode, and a length H of the nano-scale LED device satisfy following relation expression 1

$0.5Z \leq H < X+Y+2Z$, where 100 nm $\leq X \leq$ 10 μm, 100 nm $\leq Y \leq$ 10 μm, and 100 nm $\leq Z \leq$ 10 μm. [Relation Expression 1]

2. The nano-scale LED electrode assembly of claim 1, wherein the first and second electrode layers of the nano-scale LED device is not coated with the insulation film.

3. The nano-scale LED electrode assembly of claim 1, wherein the number of nano-scale LED devices is about 2 to about 100,000 per an area (100 μm ×100 μm) of the nano-scale LED electrode assembly.

4. The nano-scale LED electrode assembly of claim 1, wherein the width X of the first electrode, the width Y of the second electrode, the distance Z between the first electrode and the second electrode adjacent to the first electrode, and a length H of the nano-scale LED device satisfy following relation expression 2

$Z \leq H \leq X+Y+Z$, where 100 nm $\leq X \leq$ 10 μm, 100 nm $\leq Y \leq$ 10 μm, and 100 nm $\leq Z \leq$ 10 μm. [Relation Expression 2]

5. The nano-scale LED electrode assembly of claim 1, further comprising an insulation barrier surrounding an electrode line region to which the nano-scale LED device is connected,
    wherein a vertical distance from the base substrate to an upper end of the insulation barrier is about 0.1 μm to about 100 μm.

* * * * *